United States Patent
Ishiyama

(10) Patent No.: US 7,272,812 B2
(45) Date of Patent: Sep. 18, 2007

(54) SEMICONDUCTOR DESIGNING APPARATUS USING SUB-CIRCUIT RECOGNIZER

(75) Inventor: Yasuhiro Ishiyama, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 152 days.

(21) Appl. No.: 10/960,051

(22) Filed: Oct. 8, 2004

(65) Prior Publication Data

US 2005/0097495 A1 May 5, 2005

(30) Foreign Application Priority Data

Oct. 10, 2003 (JP) .......................... P. 2003-351536

(51) Int. Cl.
*G06F 17/50* (2006.01)
(52) U.S. Cl. .................. 716/11; 716/12; 716/17; 716/18
(58) Field of Classification Search .................. 716/1, 716/2, 11, 12, 17, 18
See application file for complete search history.

(56) References Cited

U.S. PATENT DOCUMENTS

| 6,173,433 | B1 * | 1/2001 | Katoh et al. .................. 716/1 |
| 6,249,901 | B1 * | 6/2001 | Yuan et al. ..................... 716/5 |
| 6,301,692 | B1 | 10/2001 | Kumashiro et al. |
| 6,539,525 | B1 | 3/2003 | Kwon |
| 6,647,536 | B2 | 11/2003 | Bradley et al. |

* cited by examiner

*Primary Examiner*—Thuan Do
(74) *Attorney, Agent, or Firm*—McDermott Will & Emery LLP

(57) ABSTRACT

A semiconductor designing apparatus capable of effectively performing a layout designing operation and capable of developing both a circuit designing operation and a layout designing operation at the same time is provided. When a layout designing operation as to a semiconductor memory circuit and a semiconductor analog circuit is manually carried out in a semi-automatic designing manner, both the circuit designing operation and the layout designing operation can be carried out at the same time, so that a designing time period can be shortened.

18 Claims, 33 Drawing Sheets

(1) M = 1     (2) M = 2

▓ : DIFFUSION LAYER REGION MASK PATTERN
□ : CONTACT HOLE MASK PATTERN
▓ : GATE ELECTRODE MASK PATTERN
▨ : FIRST LAYER METAL MASK PATTERN
☐ : PMOS REGION MASK PATTERN
☐ : NMOS REGION MASK PATTERN (1) SEMICONDUCTOR BEFORE INSTANCE IS ADDED (2) SEMICONDUCTOR AFTER INSTANCE HAS BEEN SEPARATED

- ▦ : DIFFUSION LAYER REGION MASK PATTERN
- □ : CONTACT HOLE MASK PATTERN
- ▩ : GATE ELECTRODE MASK PATTERN
- ▨ : FIRST LAYER METAL MASK PATTERN
- ▧ : SUBSTRATE CONTACT MASK PATTERN
- ☐ : PMOS REGION MASK PATTERN
- ☐ : NMOS REGION MASK PATTERN

FIG. 8
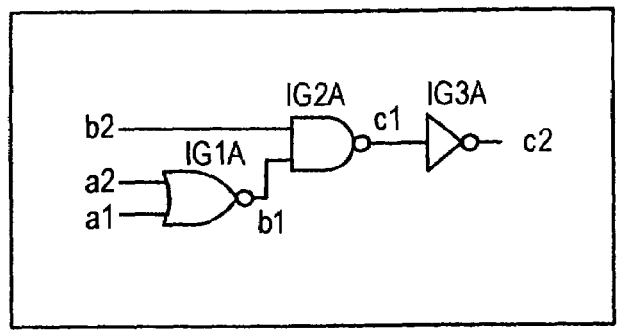
MATCHING BETWEEN
NET LIST NAMES
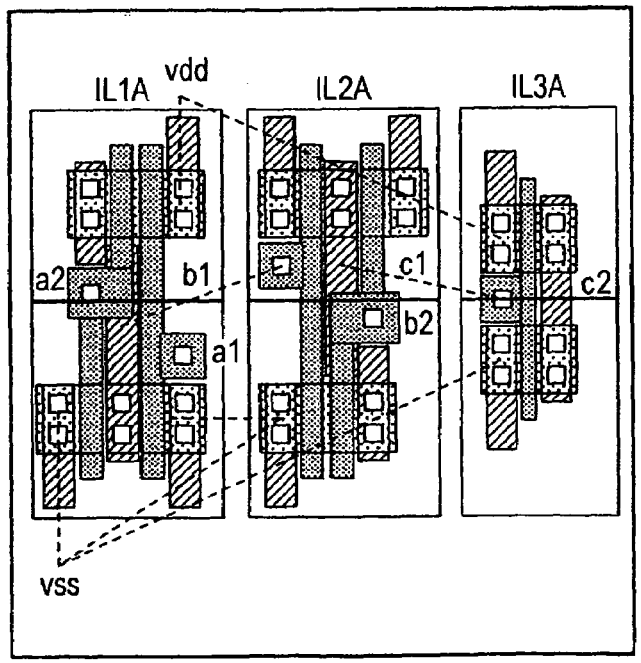
(2) SEMICONDUCTOR AFTER NET
LIST NAME HAS BEEN CHANGED

FIG. 9
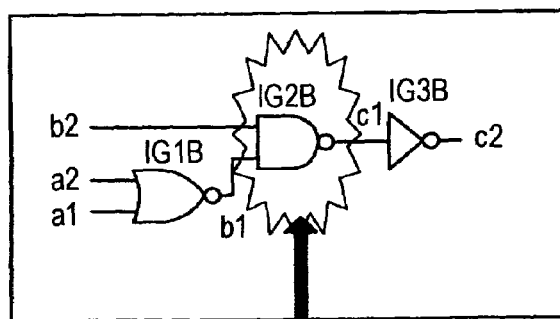
CIRCUIT
─D⟩∘─ : 2-INPUT NOR
─D⟩∘─ : 2-INPUT NAND
─▷∘─ : INVERTER
DIFFERENT POINT IS HIGHLIGHTED
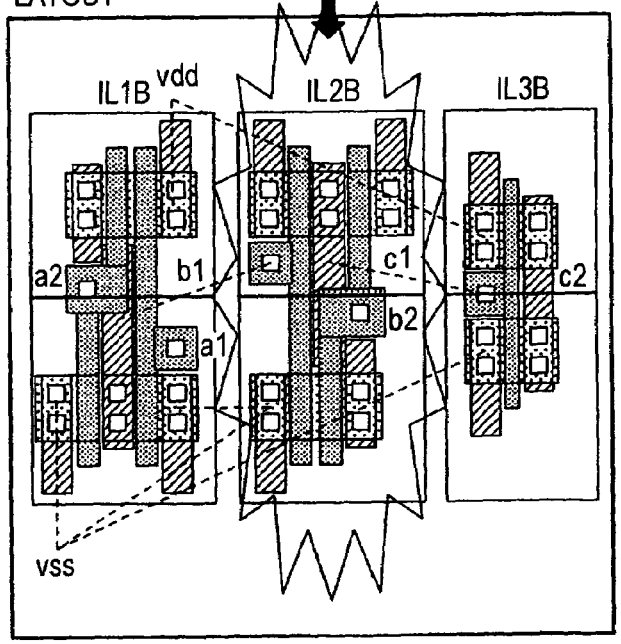
LAYOUT
▒ : DIFFUSION LAYER REGION MASK PATTERN
□ : CONTACT HOLE MASK PATTERN
▓ : GATE ELECTRODE MASK PATTERN
▨ : FIRST LAYER METAL MASK PATTERN
□ : PMOS REGION MASK PATTERN
□ : NMOS REGION MASK PATTERN
--- : FLY LINE
vdd : POWER SUPPLY POTENTIAL
vss : GROUND POTENTIAL

PROHIBITED INPUT FILE

PROHIBITED ITEM :

OUTPUT PINS OF CELL ARE PROHIBITED TO BE CONNECTED TO EACH OTHER

OUTPUT PIN OF INVERTER CELL = P0

FIG. 11
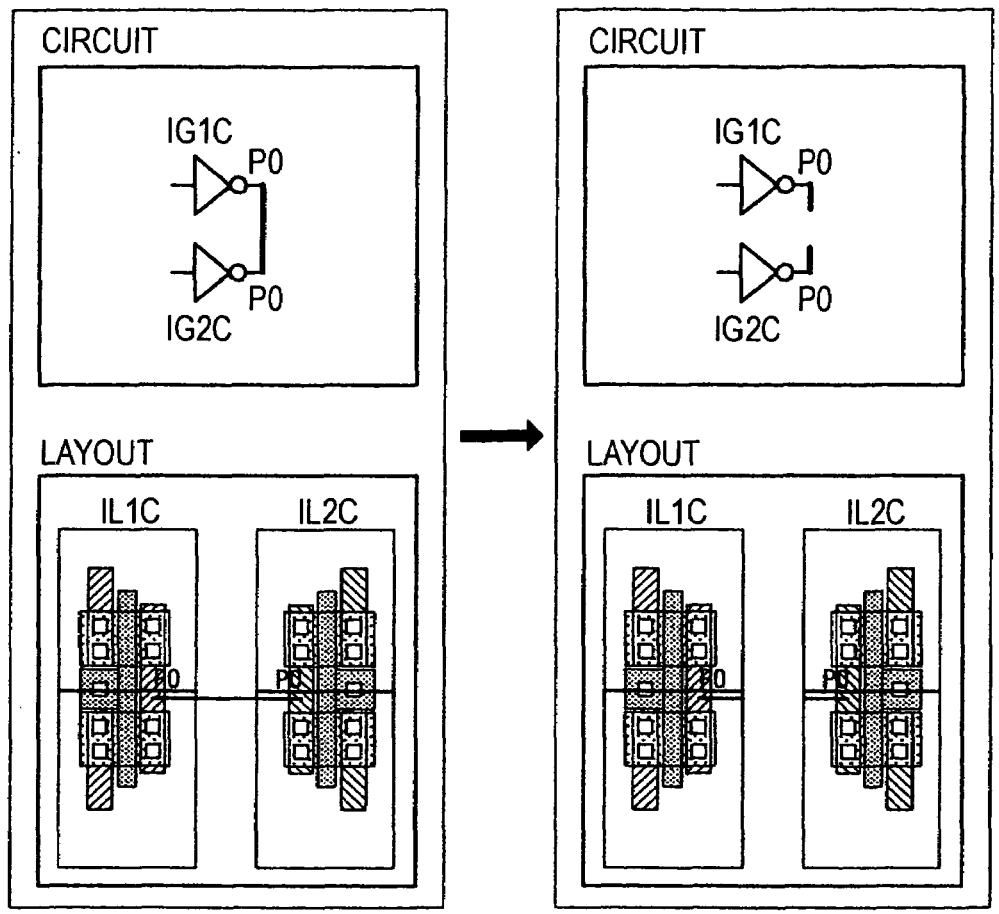
(1) SEMICONDUCTOR BEFORE PROHIBITED INPUT IS AVOIDED IN ADVANCE
(2) SEMICONDUCTOR AFTER PROHIBITED INPUT HAS BEEN AVOIDED IN ADVANCE
 : INVERTER
▨ : DIFFUSION LAYER REGION MASK PATTERN
□ : CONTACT HOLE MASK PATTERN
▨ : GATE ELECTRODE MASK PATTERN
▨ : FIRST LAYER METAL MASK PATTERN
☐ : PMOS REGION MASK PATTERN
☐ : NMOS REGION MASK PATTERN FIG. 12
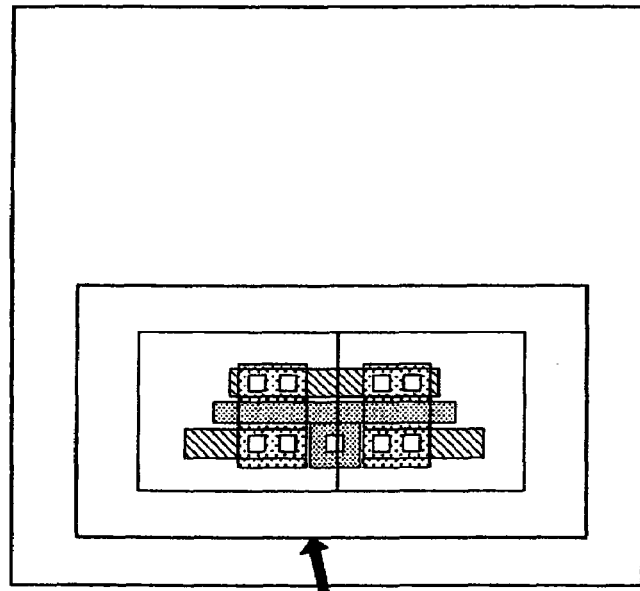
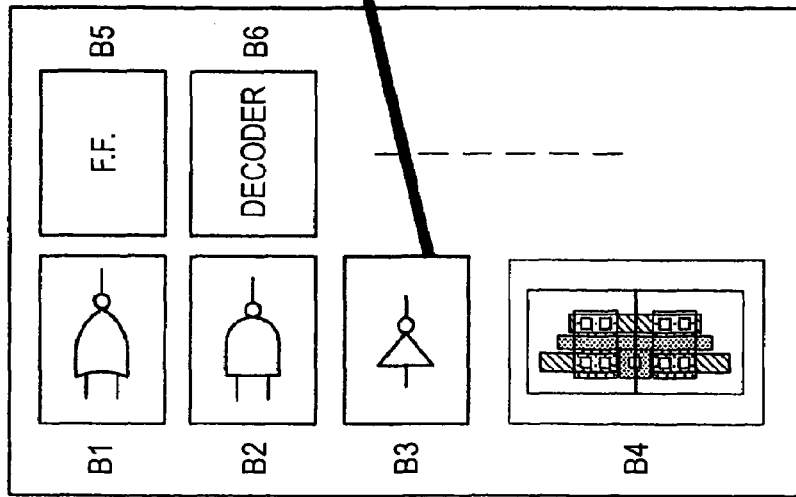

GRID DESIGNATION FILE

[BASIC SETTING PORTION]
- WC = CONTACT HOLE MASK PATTERN WIDTH
- WG1 = GATE ELECTRODE MASK PATTERN WIDTH 1
  = WG x 2
- WG2 = GATE ELECTRODE MASK PATTERN WIDTH 2
  = WC x 0.8

AFTER GRID HAS BEEN DETERMINED

- GWC = WC x GRID NUMBER
- GWG1 = WG1 x GRID NUMBER
- GWG2 = WG2 x GRID NUMBER

FIG. 16

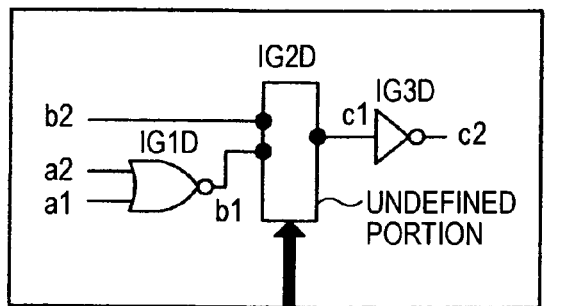

CIRCUIT

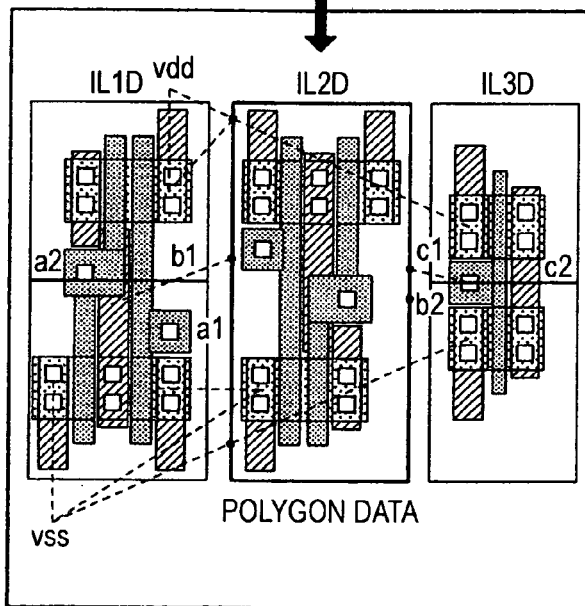

UNDEFINED PORTION OF CIRCUIT CAN BE HANDLED IN LAYOUT AS POLYGON DATA HAVING NO RELATIONSHIP WITH NET LIST

LAYOUT

POLYGON DATA

- ▦ : DIFFUSION LAYER REGION MASK PATTERN
- □ : CONTACT HOLE MASK PATTERN
- ▨ : GATE ELECTRODE MASK PATTERN
- ▨ : FIRST LAYER METAL MASK PATTERN
- ☐ : PMOS REGION MASK PATTERN
- ☐ : NMOS REGION MASK PATTERN
- --- : FLY LINE
- vdd : POWER SUPPLY POTENTIAL
- vdd : POWER SUPPLY POTENTIAL
- ☐ : POLYGON DATA REGION
- • : POLYGON DATA PIN POSITION

FIG. 17

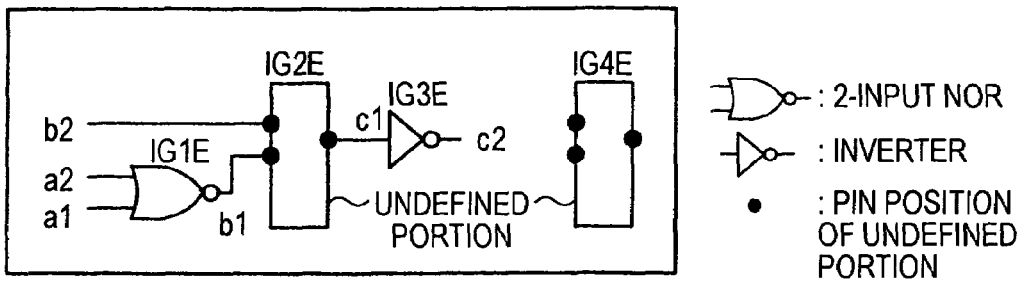

CIRCUIT

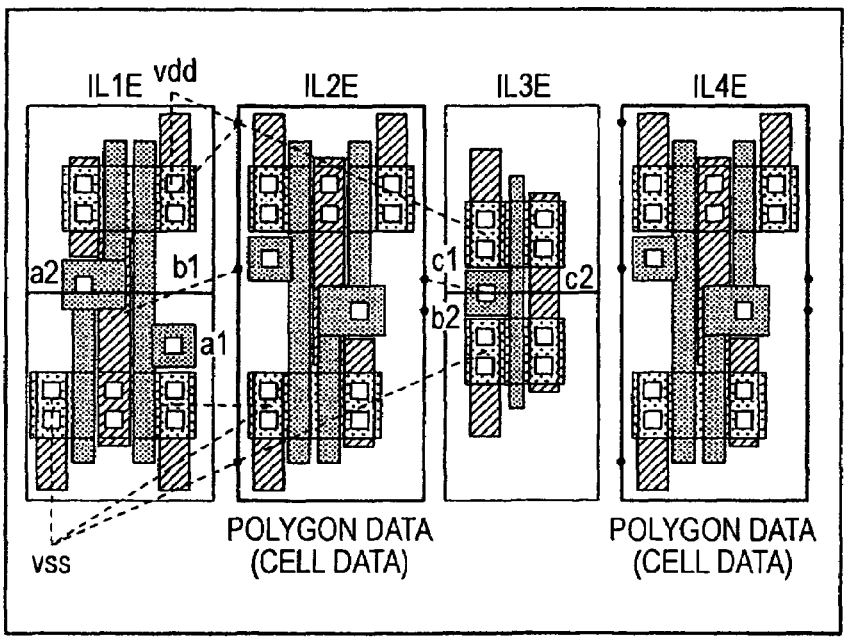

LAYOUT

- ▷○ : 2-INPUT NOR
- ▷ : INVERTER
- ● : PIN POSITION OF UNDEFINED PORTION

- ▓ : DIFFUSION LAYER REGION MASK PATTERN
- □ : CONTACT HOLE MASK PATTERN
- ▓ : GATE ELECTRODE MASK PATTERN
- ▨ : FIRST LAYER METAL MASK PATTERN
- ☐ : PMOS REGION MASK PATTERN
- ☐ : NMOS REGION MASK PATTERN
- --- : FLY LINE
- vdd : POWER SUPPLY POTENTIAL
- vss : POWER SUPPLY POTENTIAL
- ☐ : POLYGON DATA REGION
- • : POLYGON DATA PIN POSITION FIG. 18
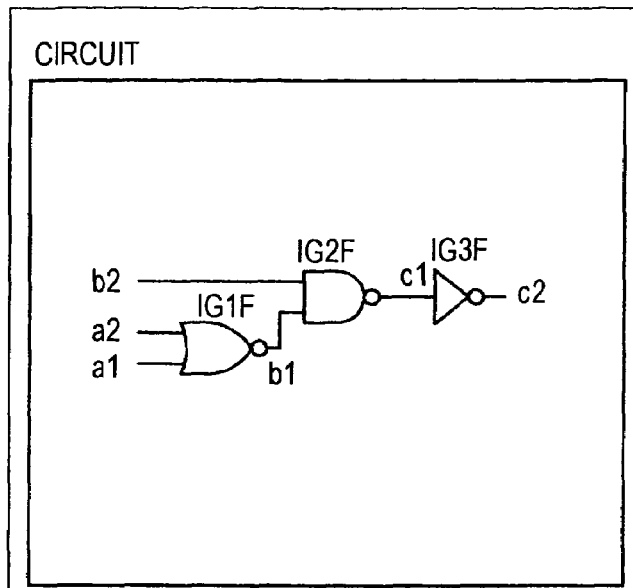
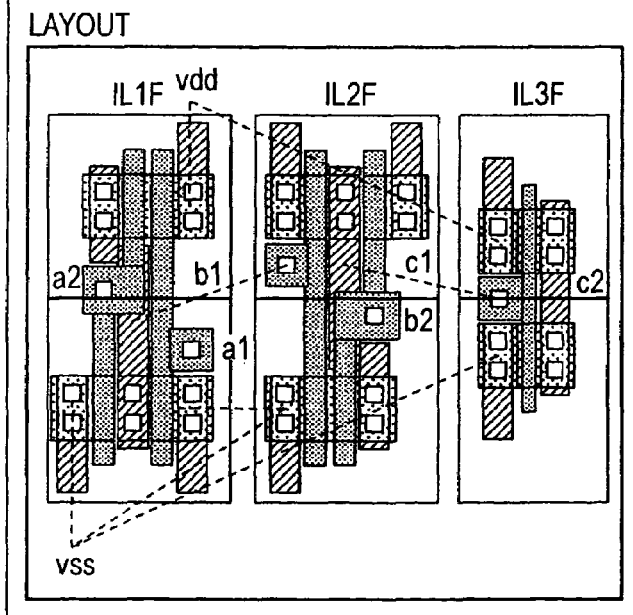
(1) SEMICONDUTOR BEFORE MIXING DISPLAY
- ▒ : DIFFUSION LAYER REGION MASK PATTERN
- □ : CONTACT HOLE MASK PATTERN
- ▓ : GATE ELECTRODE MASK PATTERN
- ▨ : FIRST LAYER METAL MASK PATTERN
- ☐ : PMOS REGION MASK PATTERN
- ☐ : NMOS REGION MASK PATTERN
- --- : FLY LINE
- vdd : POWER SUPPLY POTENTIAL
- vss : POWER SUPPLY POTENTIAL (2) SEMICONDUCTOR AFTER MIXING DISPLAY (2) SEMICONDUCTOR AFTER NET LIST NAME HAS BEEN CHANGED FIG. 22
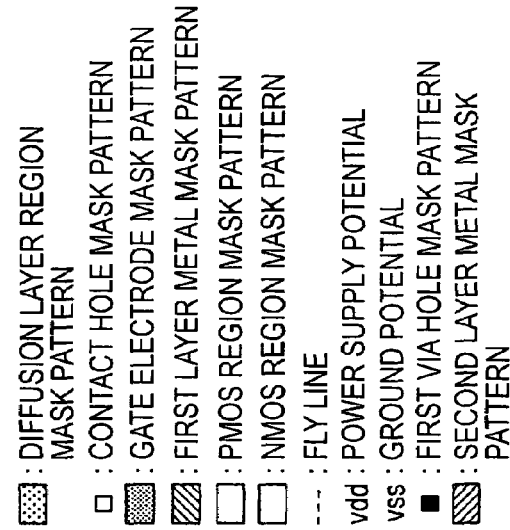
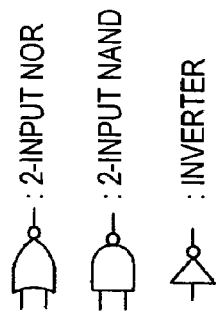
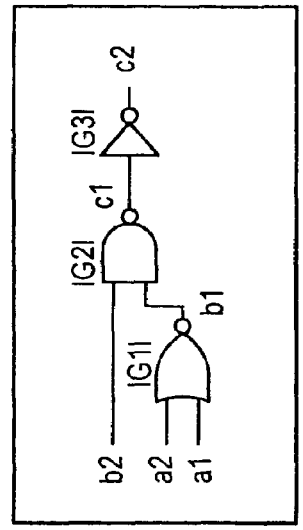
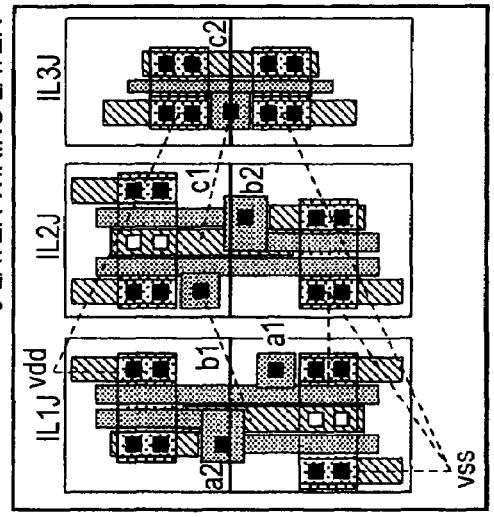
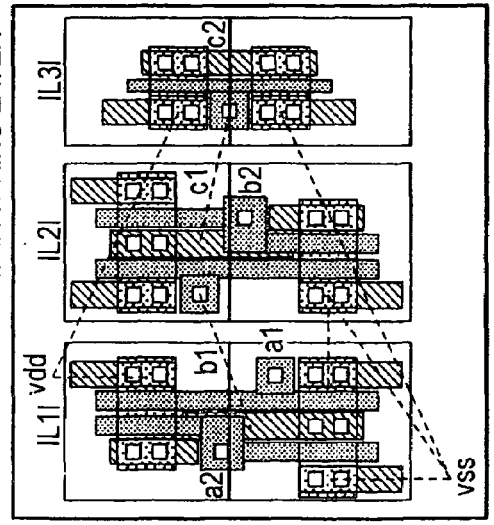

DESIGN PROCESS FILE

PROHIBITED ITEMS :

CHANGE GATE LENGTH (TRL) OF TRANSISTOR
  [IN CASE OF 2.0 μm process]
  TRL = 2μm
  [IN CASE OF 1.0 μm process]
  TRL = 1μm

FIG. 24
CIRCUIT
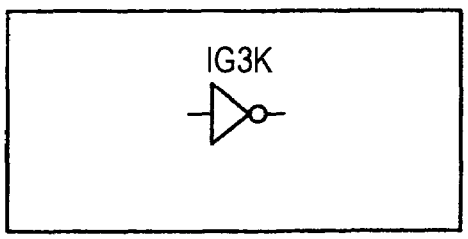
LAYOUT          LAYOUT
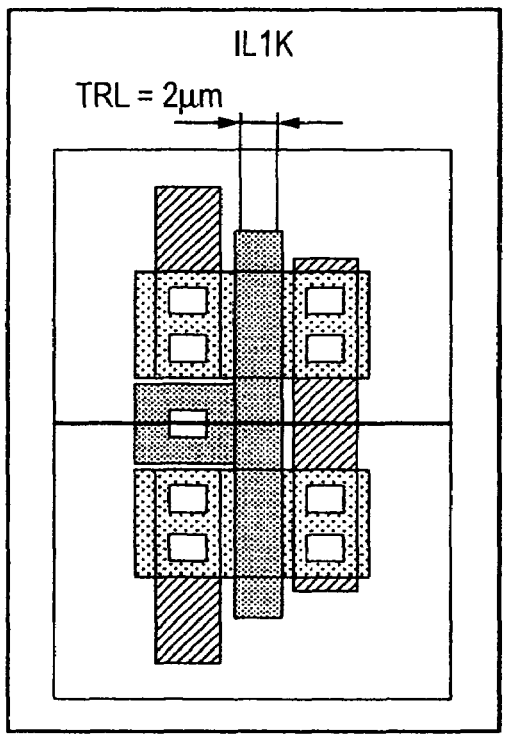
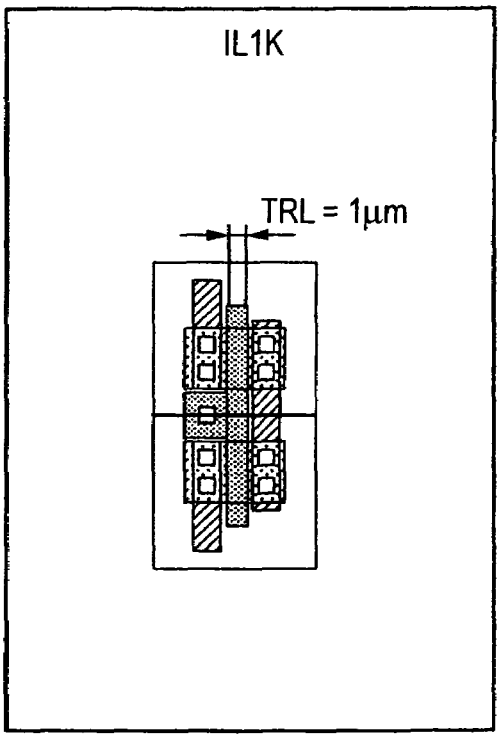
(1) IN CASE OF 2.0 μm process     (2) IN CASE OF 1.0 μm process
- ▨ : DIFFUSION LAYER REGION MASK PATTERN
- □ : CONTACT HOLE MASK PATTERN
- ▨ : GATE ELECTRODE MASK PATTERN
- ▨ : FIRST LAYER METAL MASK PATTERN
- ☐ : PMOS REGION MASK PATTERN
- ☐ : NMOS REGION MASK PATTERN ⊤ : vdd (POWER SUPPLY POTENTIAL)

−◁╎ : PMOS TRANSISTOR

−|╎ : NMOS TRANSISTOR

⊥ : vss (GROUND POTENTIAL)

▨ : DIFFUSION LAYER REGION MASK PATTERN
▨ : GATE ELECTRODE MASK PATTERN
☐ : PMOS REGION MASK PATTERN
☐ : NMOS REGION MASK PATTERN
--- : FLY LINE
vdd : POWER SUPPLY POTENTIAL
vss : GROUND POTENTIAL ▨ : DIFFUSION LAYER REGION MASK PATTERN
☐ : CONTACT HOLE MASK PATTERN
▨ : GATE ELECTRODE MASK PATTERN
▨ : FIRST LAYER METAL MASK PATTERN
☐ : PMOS REGION MASK PATTERN
☐ : NMOS REGION MASK PATTERN
--- : FLY LINE
vdd : POWER SUPPLY POTENTIAL
vss : GROUND POTENTIAL

- ▨ : DIFFUSION LAYER REGION MASK PATTERN
- □ : CONTACT HOLE MASK PATTERN
- ▤ : GATE ELECTRODE MASK PATTERN
- ▨ : FIRST LAYER METAL MASK PATTERN
- ▢ : PMOS REGION MASK PATTERN
- ▢ : AMOS REGION MASK PATTERN
- vdd : POWER SUPPLY POTENTIAL
- vss : GROUND POTENTIAL

FIG. 31

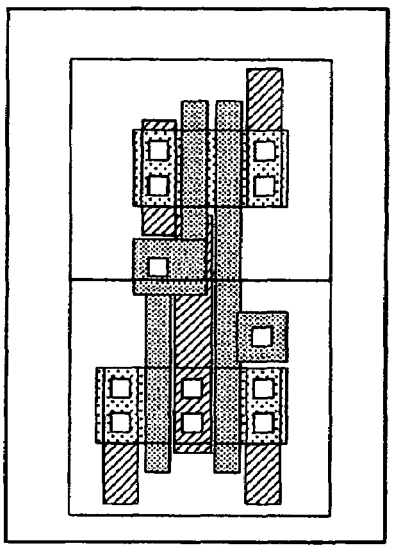

(1) MASK PATTERN OF 2-INPUT NOR

▦ : DIFFUSION LAYER REGION MASK PATTERN
▫ : CONTACT HOLE MASK PATTERN
▨ : GATE ELECTRODE MASK PATTERN
▧ : FIRST LAYER METAL MASK PATTERN
☐ : PMOS REGION MASK PATTERN
☐ : NMOS REGION MASK PATTERN

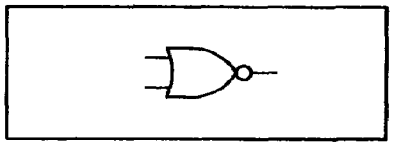

(2) GATE LEVEL CIRCUIT OF 2-INPUT NOR

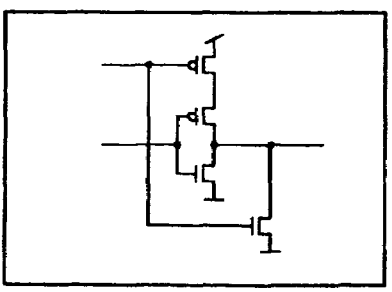

(3) TRANSISTOR LEVEL CIRCUIT OF 2-INPUT NOR

⊤ : vdd (POWER SUPPLY POTENTIAL)
⊣╱ : PMOS TRANSISTOR
⊣╲ : NMOS TRANSISTOR
⊥ : vss (GROUND POTENTIAL)

FIG. 32

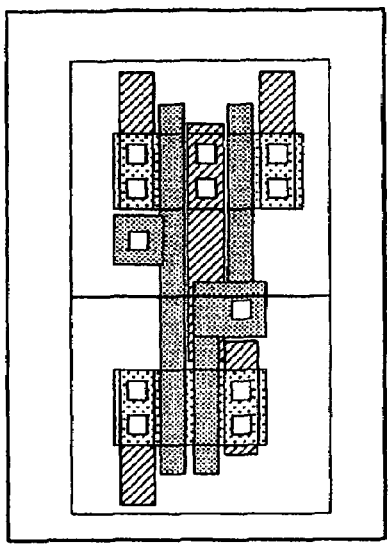

(1) MASK PATTERN OF 2-INPUT NAND

▓ : DIFFUSION LAYER REGION MASK PATTERN
▫ : CONTACT HOLE MASK PATTERN
▓ : GATE ELECTRODE MASK PATTERN
▨ : FIRST LAYER METAL MASK PATTERN
☐ : PMOS REGION MASK PATTERN
☐ : NMOS REGION MASK PATTERN

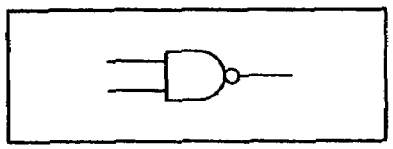

(2) GATE LEVEL CIRCUIT OF 2-INPUT NAND

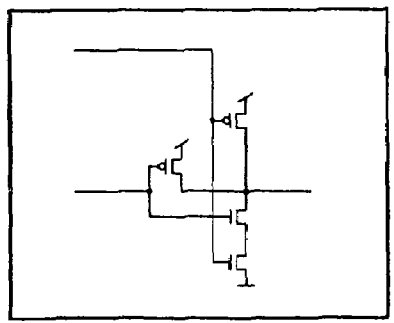

(3) TRANSISTOR LEVEL CIRCUIT OF 2-INPUT NAND

T : vdd (POWER SUPPLY POTENTIAL)
⊣c : PMOS TRANSISTOR
⊣c : NMOS TRANSISTOR
⊥ : vss (GROUND POTENTIAL)

FIG. 33

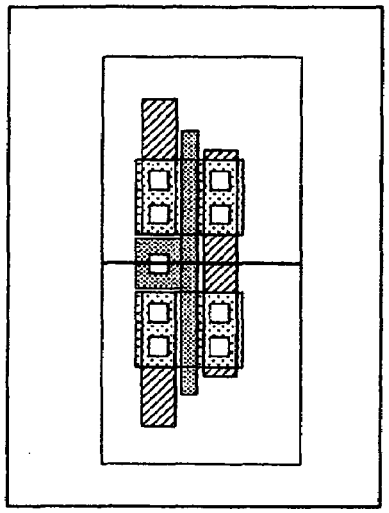

(1) MASK PATTERN OF INVERTER

▨ : DIFFUSION LAYER REGION MASK PATTERN
▫ : CONTACT HOLE MASK PATTERN
▨ : GATE ELECTRODE MASK PATTERN
▨ : FIRST LAYER METAL MASK PATTERN
☐ : PMOS REGION MASK PATTERN
☐ : NMOS REGION MASK PATTERN

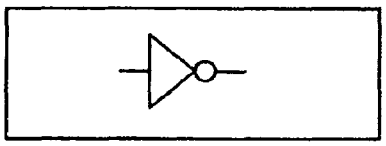

(2) GATE LEVEL CIRCUIT OF INVERTER

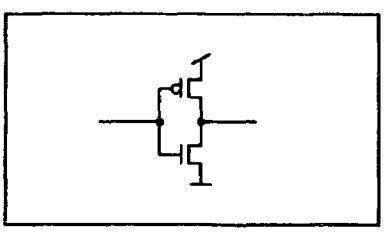

(3) TRANSISTOR LEVEL CIRCUIT OF INVERTER

⊤ : vdd (POWER SUPPLY POTENTIAL)
⊣ᵟ : PMOS TRANSISTOR
⊣ᵟ : NMOS TRANSISTOR
⊥ : vss (GROUND POTENTIAL)

SEMICONDUCTOR DESIGNING APPARATUS USING SUB-CIRCUIT RECOGNIZER

BACKGROUND OF THE INVENTION

1. Field of the Invention

The present invention is related to a semiconductor designing apparatus for designing a semiconductor circuit.

2. Description of the Related Art

Conventionally, in the case that layout designing operations as to semiconductor memory circuits and semiconductor analog circuits are carried out, the designing operations have been semi-automatically performed in a manual manner. FIG. 25 is a block diagram for schematically indicating an arrangement of a conventional semiconductor designing apparatus. The conventional semiconductor designing apparatus shown in this drawing employs such a method that a layout designing operation is carried out by a layout editing unit 5 based upon net list information of a circuit diagram and layout information.

In FIG. 25, reference numeral 1 shows an input unit; reference numeral 2 indicates a CPU for processing data based upon information entered from the input unit 1; reference numeral 3 represents a circuit editing unit for executing a circuit editing operation with respect to the input data processed by the CPU 2; reference numeral 4 indicates a circuit diagram database into which circuit diagrams used by the circuit editing unit 3 have been stored; reference numeral 5 shows a layout editing unit for executing a layout editing operation with respect to input data processed by the CPU 2; and reference numeral 6 shows a layout database into which layouts used by the layout editing unit 5 have been stored. Also, reference numeral 7 shows a design rule judging unit for checking a design rule of a layout formed by the layout editing unit 5; reference numeral 8 represents a connect extracting unit for extracting connection information of both layout data of the layout editing unit 5 and circuit data of the circuit editing unit 3; and reference numeral 9 shows an output unit for outputting a result obtained by the CPU 2.

In this case, FIG. 26 is a circuit diagram of a gate level. In FIG. 26, symbol "IG1" shows a 2-input NOR, symbols "a1" and "a2" represent inputs, and symbol "b1" indicates an output. Symbol "IG2" shows a 2-input NAND, symbols "b1" and "b2" indicate inputs, and symbol "c1" represents an output. Symbol "IG3" denotes an inverter, symbol "c1" shows an input, and symbol "c2" indicates an output.

FIG. 27 is a circuit diagram of a transistor level. In FIG. 27, symbol "IT1" shows a 2-input NOR, symbols "a1" and "a2" represent inputs, and symbol "b1" indicates an output. In the transistor level, the 2-input NOR IT1 is constituted of PMOS transistors pa1 and pa2, and NMOS transistors na1 and na2; symbol "a1" is connected to a gate of the PMOS transistor pa1, symbol "a3" is connected to a source thereof, and symbol "b1" is connected to a drain thereof; symbol "a2" is connected to a gate of the PMOS transistor pa2, symbol "vdd (supply potential)" is connected to a source thereof, and symbol "a3" is connected to a drain thereof; symbol "a1" is connected to a gate of the NMOS transistor na1, symbol "vss (ground potential)" is connected to a source thereof, symbol "b1" is connected to a drain thereof; and symbol "a2" is connected to a gate of the NMOS transistor na2, symbol "vss (ground potential)" is connected to a source thereof, and an symbol "b1" is connected to a drain thereof.

Symbol "IT2" shows a 2-input NAND, symbols "b1" and "b2" represent inputs, and symbol "c1" indicates an output. In the transistor level, the 2-input NAND IT2 is constituted by PMOS transistors pb1 and pb2, and NMOS transistors nb1 and nb2; symbol "b1" is connected to a gate of the PMOS transistor pb1, symbol "vdd (supply potential)" is connected to a source thereof, and symbol "c1" is connected to a drain thereof; symbol "b2" is connected to a gate of the PMOS transistor pa2, symbol "vdd (supply potential)" is connected to a source thereof, and symbol "c1" is connected to a drain thereof; symbol "b1" is connected to a gate of the NMOS transistor nb1, symbol "b3" is connected to a source thereof, symbol "c1" is connected to a drain thereof; and symbol "b2" is connected to a gate of the NMOS transistor nb2, symbol "vss (ground potential)" is connected to a source thereof, and symbol "b3" is connected to a drain thereof.

Symbol "IT3" shows an inverter, symbol "c1" indicates an input, and symbol "c2" represents an output. In the transistor level, the inverter IT3 is constructed of a PMOS transistor pc1 and an NMOS transistor nc1. Symbol "c1" is connected to a gate of the PMOS transistor pc1, symbol "vdd (supply potential)" is connected to a source thereof, and symbol "c2" is connected to a drain thereof; symbol "c1" is connected to a gate of the NMOS transistor nc1, symbol "vss (ground potential)" is connected to a source thereof, and symbol "c2" is connected to a drain thereof.

FIG. 28 is a structural diagram of a layout of a transistor level. In FIG. 28, this layout is constituted by PMOS transistors pa1, pa2, pb1, pb2, pc1, and NMOS transistors na1, na2, nb1, nb2, nc1. Symbol "a1" is connected to a gate of the PMOS transistor pa1, symbol "a3" is connected to a source thereof, and symbol "b1" is connected to a drain thereof; symbol "a2" is connected to a gate of the PMOS transistor pa2, symbol "vdd (supply potential)" is connected to a source thereof, and symbol "a3" is connected to a drain thereof; symbol "a1" is connected to a gate of the NMOS transistor na1, symbol "vss (ground potential)" is connected to a source thereof, symbol "b1" is connected to a drain thereof; symbol "a2" is connected to a gate of the NMOS transistor na2, symbol "vss (ground potential)" is connected to a source thereof, and an symbol "b1" is connected to a drain thereof. Symbol "b1" is connected to a gate of the PMOS transistor pb1, symbol "vdd (supply potential)" is connected to a source thereof, and symbol "c1" is connected to a drain thereof; symbol "b2" is connected to a gate of the PMOS transistor pa2, symbol "vdd (supply potential)" is connected to a source thereof, and symbol "c1" is connected to a drain thereof; symbol "b1" is connected to a gate of the NMOS transistor nb1, symbol "b3" is connected to a source thereof, and symbol "c1" is connected to a drain thereof; symbol "b2" is connected to a gate of the NMOS transistor nb2, symbol "vss (ground potential)" is connected to a source thereof, and symbol "b3" is connected to a drain thereof; symbol "c1" is connected to a gate of the PMOS transistor pc1, symbol "vdd (supply potential)" is connected to a source thereof, and symbol "c2" is connected to a drain thereof; and symbol "c1" is connected to a gate of the NMOS transistor nc1, symbol "vss (ground potential)" is connected to a source thereof, and symbol "c2" is connected to a drain thereof. It should be understood that connection portions of the respective nodes are indicated by fly lines.

FIG. 29 is a structural diagram obtained during a layout process. In FIG. 29, symbol "IL1" shows a 2-input NOR, symbols "a1" and "a2" indicate inputs, and symbol "b1" represents an output. In the transistor level, the 2-input NOR IL1 is arranged by PMOS transistors pa1, pa2, and NMOS transistors na1, na2. Symbol "IL2" shows a 2-input NAND, symbols "b1" and "b2" indicate inputs, and symbol "c1"

represents an output. In the transistor level, the 2-input NAND IL2 is arranged by PMOS transistors pb1, pb2, and NMOS transistors nb1, nb2. Symbol "IL3" shows an inverter, symbol indicates an input, and symbol "c2" represents an output. In the transistor level, the inverter IL3 is arranged by a PMOS transistor pc1, and an NMOS transistor nc1. It should also be understood that connection portions of the respective nodes are represented by fly lines.

FIG. 30 is a layout structural diagram obtained after the layout process has been accomplished. In FIG. 30, in the 2-input NOR, symbols "a1" and "a2" are inputs, and symbol "b1" shows an output; in the 2-input NAND, symbols "b1" and "b2" are inputs, and symbol "c1" shows an output; and in the inverter, symbol "c1" represents an input, and symbol "c2" shows an output.

FIG. 31 to FIG. 33 show an example of sub-circuits which are contained in the circuit of FIG. 26. FIG. 31 is a structural diagram of a 2-input NOR, (1) represents a mask pattern, (2) shows a circuit diagram of a gate level, and (3) indicates a circuit diagram of a transistor level. FIG. 32 is a structural diagram of a 2-input NAND, (1) represents a mask pattern, (2) shows a circuit diagram of a gate level, and (3) indicates a circuit diagram of a transistor level. FIG. 33 is a structural diagram of an inverter, (1) represents a mask pattern, (2) shows a circuit diagram of a gate level, and (3) indicates a circuit diagram of a transistor level.

In the method executed in the conventional semiconductor designing apparatus, such a layout as shown in FIG. 30 is constructed by editing the circuit diagram of the gate level shown in FIG. 26 to obtain the circuit of the transistor level indicated in FIG. 27 by the circuit editing unit 3. Otherwise, the designing operation is carried out from the circuit diagram of the transistor level shown in FIG. 27, data is supplied to the layout editing unit 5, and the layout of the transistor level indicated in FIG. 28 is rearranged to obtain the layout as represented in FIG. 30 in such a manner that arranging operations and wiring operations are semi-automatically carried out every element.

Next, a description is made of operations of the conventional semiconductor designing apparatus with employment of the above-explained arrangement. First, a circuit diagram entered from the input unit 1 of FIG. 25 is selected by the CPU 2. At this time, the CPU 2 enters the circuit diagram information inputted from the input unit 1 into the circuit editing unit 3. Next, this circuit diagram information is edited by the circuit editing unit 3 in response to an editing instruction entered from the input unit 1, and then, the edited circuit diagram is stored in the circuit diagram database 4. Next, layout information entered from the input unit 1 is inputted to the layout editing unit 5. Subsequently, this layout information is edited by the layout editing unit 5 in accordance with an editing instruction entered from the input unit 1, and then the edited layout information is stored in the layout database 6. At this time, in such a case that a design rule judging instruction is entered from the input unit 1, the design rule control unit 7 performs a check of a design rule as to the layout edited by the layout editing unit 5. Also, in such a case that a connection extracting portion instruction is entered from the input unit 1, the connection extracting unit 8 extracts both the circuit data of the circuit editing unit 3 and the connection information of the layout data of the layout editing unit 5. As a result, the circuit diagram information, the layout information, the check result of the design rule, and the connection extraction result are outputted from the output unit 9.

It should be noted that the conventional layout designing operation has been performed by way of the polygon layout (for example, refer to "That's understood, Electronic Designing EDA (P. 125) Polygon Editor" special issue, Japanese magazine NIKKEI ELECTRONICS (10-14) 1996).

However, in the above-described conventional semiconductor designing apparatus, there are the below-mentioned problems:

(1). The internal portions of the structural elements contained in the circuits must be arranged and must be wired. Even in the case that the circuits having the same structures are used, the internal portions of the structural elements must be repeatedly arranged and wired every time the circuit is used, which cause that the designing time period is prolonged.

(2). In such a case that the structures of the structural elements are determined, the internal shapes of the structural elements cannot be changed.

(3). Since the attributes of the elements cannot be changed, a degree of freedom as to the layout is restricted.

(4). Since instances cannot be added to the elements, substrate contacts and the like cannot be inputted which do not depend upon the circuit diagrams.

(5). The layout designing operations cannot be commenced until the circuit diagram are determined.

(6). The net names and the instance names of the circuits and the layouts are not made coincident with each other, so that debugging operations become difficult.

(7). The different points between the circuits and the layouts cannot be readily retrieved, so that debugging operations become difficult.

(8). The inputs which should be prohibited cannot be avoided in advance, so that erroneous designing operations occur.

(9). Since the layout data can be hardly recognized by any persons other than persons who have well skilled in the art, lengthy time is necessarily required in order to get acquainted with the layouts.

(10). Although various sorts of shapes are prepared in order to realize the layout data having the functions, layouts cannot be freely selected in order to be adapted to characteristics of design portions.

(11). Since the design rules have not yet been determined, the layout designing operations cannot be commenced.

(12). In such a case that data whose function has not yet been firmed is entered, the layout designing operation cannot be carried out.

(13). In the case that temporal data is formed by employing data whose function has not yet been firmed, this temporal data cannot be reused.

(14). When the circuits are edited, only the data about the circuits are merely displayed. Also, when the layouts are edited, only the data about the layouts are merely displayed. As a result, mutual recognizing characteristics between the circuits and the layouts are deteriorated.

(15). The portions which are not changed cannot be designated, so that erroneous corrections may be made.

(16). Since comments which bridge the circuits and the layouts cannot be made up, the designing information cannot be sufficiently transferred between the circuit designers and the layout designers.

(17). Since the layouts cannot be prepared which are adapted to the designed wiring layers, the layout must be formed every designed wiring layers, which requires a large number of designing steps.

(18). Since the design data must be formed every process, even when similar circuits are designed, the design data cannot be applied to different processes.

SUMMARY OF THE INVENTION

The present invention has been made to solve the above-explained problems, and therefore, has an object to provide a semiconductor designing apparatus capable of effectively designing a layout, and further, capable of developing both a circuit design and a layout design at the same time.

To solve the above-described problems, a semiconductor designing apparatus, according to claim 1 of the present invention, is featured by such a semiconductor designing apparatus comprising: data processing means for processing data based upon information entered from input means; a circuit diagram database for storing thereinto circuit diagram data; a layout database for storing thereinto layout data; circuit editing means for executing a circuit editing operation with respect to the data processed by the data processing means by employing the circuit database; and layout editing means for executing a layout editing operation with respect to the data processed by the data processing means by employing the layout data; in which the semiconductor designing apparatus is further comprised of: sub-circuit recognizing means for recognizing a sub-circuit every function from the circuit data contained in the data entered by the data processing means.

In accordance with this arrangement, the layout can be produced every function, so that the internal arranging operation and the internal wiring operation of the structural elements can be omitted, and thus, the designing time period can be shortened.

Also, a semiconductor designing apparatus, according to claim 2 of the present invention, is featured by such a semiconductor designing apparatus as recited in claim 1, further comprising: element structure separating means for separating an element structure of the sub-circuit every element.

In accordance with this arrangement, the element structures can be separated, and the internal shape of the structural elements can be readily changed, so that the freedom degree of the designing operation can be improved.

Also, a semiconductor designing apparatus, according to claim 3 of the present invention, is featured by such a semiconductor designing apparatus as recited in claim 2, further comprising: element attribute designating means for changing an attribute of the element.

In accordance with this arrangement, the attributes of the elements can be changed, and the internal shape of the structural elements can be readily changed, so that the freedom degree of the designing operation can be improved.

Also, a semiconductor designing apparatus, according to claim 4 of the present invention, is featured by such a semiconductor designing apparatus as recited in claim 2, further comprising: instance adding means for adding an instance to the element.

In accordance with this arrangement, the instance can be added to the element, so that the insertion such as the substrate contact which does not depend upon the circuit diagram can be added to the arbitrary place.

Also, a semiconductor designing apparatus, according to claim 5 of the present invention, is featured by such a semiconductor designing apparatus as recited in claim 1, further comprising: provisional net name producing means for producing a provisional net list name in such a case that since an instruction for forming a layout having no circuit diagram is issued from the input means, a new layout is formed by the layout editing means and a circuit is formed by the circuit editing means; and circuit net name judging means for judging a relative relationship between a net list name of the circuit and a net list name of the layout.

In accordance with this arrangement, the layout designing operation can be commenced before the circuit diagram is determined, and thereafter, the matching state of the net connection can be confirmed, so that both the circuit and the layout can be designed at the same time, and the designing time period can be shortened.

Also, a semiconductor designing apparatus, according to claim 6 of the present invention, is featured by such a semiconductor designing apparatus as recited in claim 1, further comprising: net name adjusting means for making a net list name of a circuit coincident with a net list name of a layout in such a case that an instruction for making the net list names of the circuit and the layout coincident with each other is issued from the input means.

In accordance with this arrangement, the names of the net list and the instance as to the circuit diagram can be made coincident with the names of the net list and the instance as to the layout in the automatic manner, so that the debugging operation can be readily carried out.

Also, a semiconductor designing apparatus, according to claim 7 of the present invention, is featured by such a semiconductor designing apparatus as recited in claim 1, further comprising: different point judging means operated in such a manner that in the case that an instruction for displaying a different point between a circuit and a layout is issued from the input means, the different point judging means confirms a connection condition between the circuit and the layout based upon the circuit diagram information of the circuit editing means and the layout information of the layout editing means, and judges a different point in the connection condition of the circuit and the layout, and then highlights the judged different point.

In accordance with this arrangement, the different point between the circuit and the layout can be highlighted, so that the debugging operation can be easily carried out.

Also, a semiconductor designing apparatus, according to claim 8 of the present invention, is featured by such a semiconductor designing apparatus as recited in claim 1, further comprising: prohibited input judging means operated in such a manner that while a circuit forming operation is carried out by the circuit editing means in response to an instruction for forming a circuit diagram issued from the input means, the prohibited input judging means judges a prohibited input, and prohibits an editing operation in the circuit editing means as to an item of the prohibited input.

In accordance with this arrangement, the prohibited input can be avoided in advance, so that the erroneous designing operation can be prevented.

Also, a semiconductor designing apparatus, according to claim 9 of the present invention, is featured by such a semiconductor designing apparatus as recited in claim 1, further comprising: icon link means for displaying an icon image indicative of functions of various sorts of elements on an editing screen when either a circuit editing operation or a layout editing operation is carried out, for producing a layout corresponding to an element designated by a user within the icon image, and for displaying the produced layout.

In accordance with this arrangement, the relevant layout can be produced by depressing the icon indicative of the function, so that the recognizing characteristic during the designing operation can be improved and the developing term can be shortened.

Also, a semiconductor designing apparatus, according to claim 10 of the present invention is featured by such a semiconductor designing apparatus as recited in claim 1, further comprising: library designating means operated in such a manner that in the case that a forming instruction is issued from the data processing means, the library designating means processes circuit data of the circuit diagram database and layout data of the layout database in the form of libraries respectively, the library-processed circuit data can be used in the circuit editing means, and the library-processed layout data can be used in the layout editing means.

In accordance with this arrangement, the layout every function can be formed in the library form, so that the various sorts of shapes can be generated in an easy manner, and a total number of designing steps can be reduced.

Also, a semiconductor designing apparatus, according to claim 11 of the present invention, is featured by such a semiconductor designing apparatus as recited in claim 1, further comprising: design grid correcting means operated in such a manner that in the case that an instruction for forming a layout is issued from the input means, a layout forming operation is carried out by the layout editing means without setting a grid, and thereafter, an instruction for designating a grid is issued from the input means, the design grid correcting means performs a grid designation for the layout data of the layout database.

In accordance with this arrangement, the design grid can be determined in the later stage, so that the designing operation can be commenced before the design rule is defined.

Also, a semiconductor designing apparatus, according to claim 12 of the present invention, is featured by such a semiconductor designing apparatus as recited in claim 1, further comprising: function undefined portion forming means for forming an undefined portion which has not yet been defined within a circuit as such a polygon data which has no relationship with a net list within a layout.

In accordance with this arrangement, the undefined portion in the circuit can be connected to the polygon data having no net list, so that the data whose function has not yet been defined can be handled.

Also, a semiconductor designing apparatus, according to claim 13 of the present invention, is featured by such a semiconductor designing apparatus as recited in claim 12, further comprising: cell-process executing means for cell-processing the polygon data.

In accordance with this arrangement, the polygon data can be processed in the cell form, so that the data whose function has not yet been defined can be reused.

Also, a semiconductor designing apparatus, according to claim 14 of the present invention, is featured by such a semiconductor designing apparatus as recited in claim 1, further comprising: mutual display means operated in such a manner that in the case that while an instruction for forming a layout is issued from the input means, the layout is formed in the layout editing means, and thereafter, another instruction for selectively displaying a circuit and a layout is issued from the input means, the mutual display means selectively mixes the display of the circuit with the display of the layout.

In accordance with this arrangement, the display of the circuit can be selectively mixed with the display of the layout, so that the circuit recognizing characteristic during the designing operation can be improved and the erroneous designing operation can be avoided.

Also, a semiconductor designing apparatus, according to claim 15 of the present invention, is featured by such a semiconductor designing apparatus as recited in claim 1, further comprising: lock designating means operated in such a manner that in the case that an instruction for locking in either a circuit or a layout is issued from the input means, the lock designating means locks a subject place of the circuit diagram database and a subject place of the layout database with respect to the corresponding circuit and the corresponding layout.

In accordance with this arrangement, the designated cell can be locked, so that the cell which has been locked cannot be edited, and thus, it is possible to prevent such an erroneous correction as to the cell which is prohibited to be changed.

Also, a semiconductor designing apparatus, according to claim 16 of the present invention, is featured by such a semiconductor designing apparatus as recited in any one of claim 1, further comprising: comment input means operated in such a manner that in the case that an instruction for inputting a comment in either a circuit or a layout is issued from the input means, the comment input means inputs a comment in a subject place of the circuit diagram database and a subject place of the layout database with respect to the corresponding circuit and the corresponding layout.

In accordance with this arrangement, the comment input for the circuit can be linked to the comment input for the layout, so that the comment input unit can avoid that the duty of the circuit designer is erroneously transferred to the layout designer.

Also, a semiconductor designing apparatus, according to claim 17 of the present invention, is featured by such a semiconductor designing apparatus as recited in claim 1, further comprising: a layout database for storing thereinto layout data of a wiring line layer; and use cell selecting means operated in such a manner that in the case that while an instruction for forming a layout is issued from the input means, a layout forming operation is carried out in the layout editing means, and thereafter, another instruction for designating a wiring layer to be used is issued from the input means, the use cell selecting means selects layout data of the corresponding wiring layer from the layout database to apply the selected layout data to the layout editing means.

In accordance with this arrangement, the use cell selecting unit can automatically use the cells in the discriminatable manner every wiring layer, so that the optimum cell can be selected with respect to each of the designed wiring layers.

Also, a semiconductor designing apparatus, according to claim 18 of the present invention, is featured by such a semiconductor designing apparatus as recited in claim 1, further comprising: design process changing means operated in such a manner that in the case that while an instruction for forming a layout is issued from the input means, a layout forming operation is carried out under process condition which has been defined in the beginning by the layout editing means, and thereafter, another instruction for changing the process condition is issued from the input means, the design process changing means changes the process condition with respect to the layout data of the layout database.

In accordance with this arrangement, the data can be converted into the data used for the various sorts of processes, the data can be applied/expanded to the different processes.

In accordance with the present invention, since the sub-circuit recognizing means for recognizing the sub-circuit every function from the circuit data is employed, the layout can be produced every function, so that the internal arranging operation and the internal wiring operation of the structural elements can be omitted, and thus, the designing time period can be shortened.

BRIEF DESCRIPTION OF THE DRAWINGS

FIG. 8 is a structural diagram in the semiconductor designing apparatus according to one embodiment of the present invention.

FIG. 9 is a structural diagram in the semiconductor designing apparatus according to one embodiment of the present invention.

FIG. 11 is a structural diagram in the semiconductor designing apparatus according to one embodiment of the present invention.

FIG. 12 is a structural diagram in the semiconductor designing apparatus according to one embodiment of the present invention.

FIG. 16 is a structural diagram in the semiconductor designing apparatus according to one embodiment of the present invention.

FIG. 17 is a structural diagram in the semiconductor designing apparatus according to one embodiment of the present invention.

FIG. 18 is a structural diagram in the semiconductor designing apparatus according to one embodiment of the present invention.

FIG. 22 is a structural diagram in the semiconductor designing apparatus according to one embodiment of the present invention.

FIG. 24 is a structural diagram in the semiconductor designing apparatus according to one embodiment of the present invention.

FIG. 31 is the structural diagram in the conventional semiconductor designing apparatus.

FIG. 32 is the structural diagram in the conventional semiconductor designing apparatus.

FIG. 33 is the structural diagram in the conventional semiconductor designing apparatus.

DESCRIPTION OF THE PREFERRED EMBODIMENTS

Referring now to drawings, best modes for carrying out the present invention will be described in detail.

Figure 1:
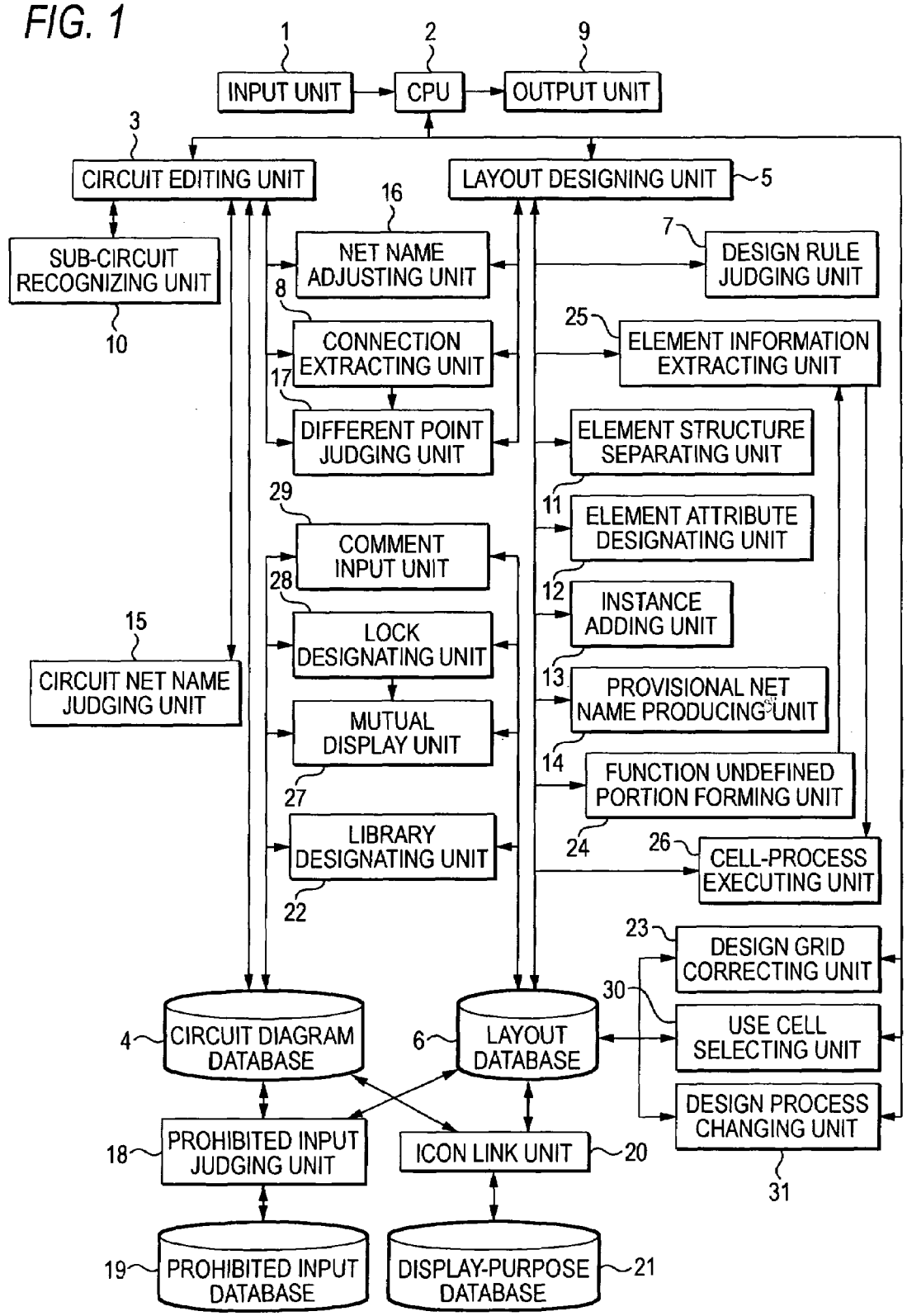
FIG. 1 is a block diagram for indicating an arrangement of a semiconductor designing apparatus according to one embodiment of the present invention.

FIG. 1 is a block diagram for showing an arrangement of a semiconductor designing apparatus according to an embodiment of the present invention. It should be noted that when FIG. 26 to FIG. 33 employed in the description of the conventional technique are required so as to explain this embodiment, these drawings will be employed.

The semiconductor designing apparatus, according to this embodiment, is equipped with an input unit 1, a CPU (data processing means) 2, a circuit editing unit (circuit editing means) 3, a circuit diagram database 4, a layout editing unit (layout editing means) 5, a layout database 6, a design rule judging unit 7, a connection extracting unit 8, an output unit 9, and a sub-circuit recognizing unit (sub-circuit recognizing means) 10. The semiconductor designing apparatus is further equipped with an element structure separating unit (element structure separating means) 11, an element attribute designating unit (element attribute designating means) 12, an instance adding unit (instance adding means) 13, a provisional net name producing unit (provisional net name producing means) 14, a circuit net name judging unit (circuit net name judging means) 15, a net name adjusting unit (net name adjusting means) 16, a different point judging unit 17, a prohibited input judging unit (prohibited input judging means) 18, a prohibited input database 19, and an icon link unit (icon link means) 20. The semiconductor designing apparatus is further provided with a display-purpose database 21, a library designating unit (library designating means) 22, a design grid correcting unit (design grid correcting means) 23, a function undefined portion forming unit (function undefined portion forming means) 24, an element information extracting unit 25, a cell-process executing unit (cell-process executing means) 26, a mutual display unit (mutual display means) 27, a lock designating unit (lock designating means) 28, a comment input unit (comment input means) 29, a use cell selecting unit (use cell selecting means) 30, and also, a design process changing unit (design process changing means) 31. It should also be noted that the above-explained connection extracting unit 8 and different process extracting unit 17 constitute a different point extracting means.

Since the sub-circuit recognizing unit 10 produces a layout every function, an internal arranging operation and a wiring operation of structural elements can be omitted. Since the element structural separating unit 11 can separate the element structures, an internal shape of the structural elements can be readily changed. Since the element attribute designating portion 12 changes attributes of elements, a degree of design freedom can be improved. Since the instance adding unit 13 can add an instance to an element, an insertion such as a substrate contact which does not depend upon a circuit diagram is added to an arbitrary portion. The provisional net name producing unit 14 applies provisional names with respect to a net list and an instance under designing operation. The circuit net name judging unit 15 mutually judges a circuit diagram with respect to a net list of a layout and a name of an instance.

The net name adjusting unit 16 automatically makes a circuit diagram coincident with a net list of a layout and a name of an instance. The difference point judging unit 17 highlights a difference point between a circuit and a layout. The prohibited input judging unit 18 avoids a prohibited input in advance. The prohibited input database 19 stores thereinto prohibited inputs. The icon link unit 20 applies an icon indicative of a function and produces a layout. The library designating unit 22 forms layouts as to respective functions in the form of a library. Since the design grid correcting unit 23 post-determines a design grid, a designing operation can be carried out before a design rule is defined. The function undefined portion forming unit 24 connects an undefined portion in a circuit with respect to such a polygon data having no net list, so that the function undefined portion forming unit 24 can handle the function undefined data.

The cell-process executing unit 26 processes polygon data in the form of a cell. The element information extracting unit 25 can reuse the function undefined data. The mutual display unit 27 selectively displays circuits and layouts in a mixing manner. The lock designating unit 28 locks a designated cell so as to cause this locked cell not to be edited, so that this lock designating unit 28 prevents to erroneously correct such a cell which is not changed. Since the comment input unit 29 links a comment input of a circuit to a comment input of a layout, this comment input unit 29 avoids that a duty of a circuit designer is erroneously transferred to a layout designer. The use cell selecting unit 30 automatically uses cells in a discriminatable manner every wiring layer, so that the use cell selecting unit 30 selects an optimum cell every designed wiring layer. The design process changing unit 31 converts data into data used for various sorts of process operations, so that the design process changing unit 31 can apply/expand the data even for different processes.

Figure 2:
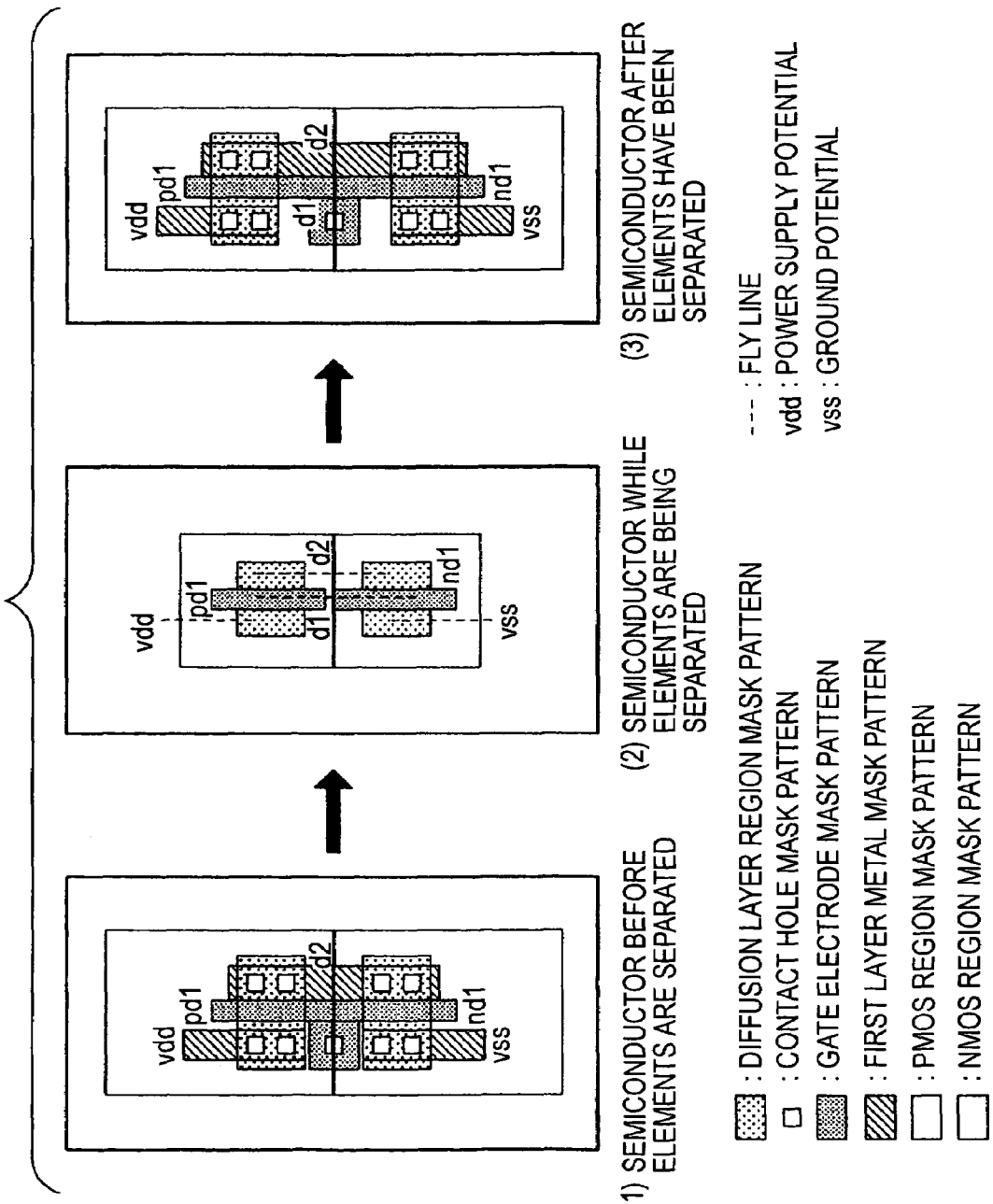
FIG. 2 is a structural diagram in the semiconductor designing apparatus according to one embodiment of the present invention.
Figure 3:
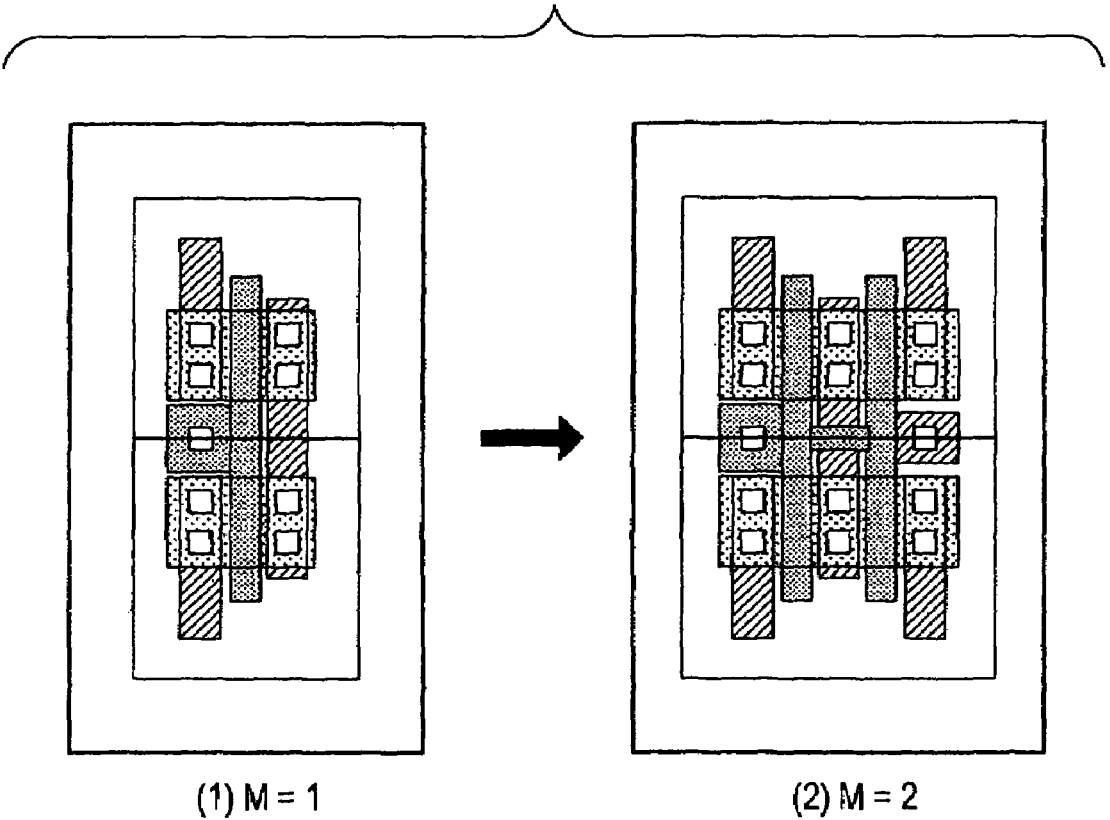
FIG. 3 is a structural diagram in the semiconductor designing apparatus according to one embodiment of the present invention.
Figure 4:
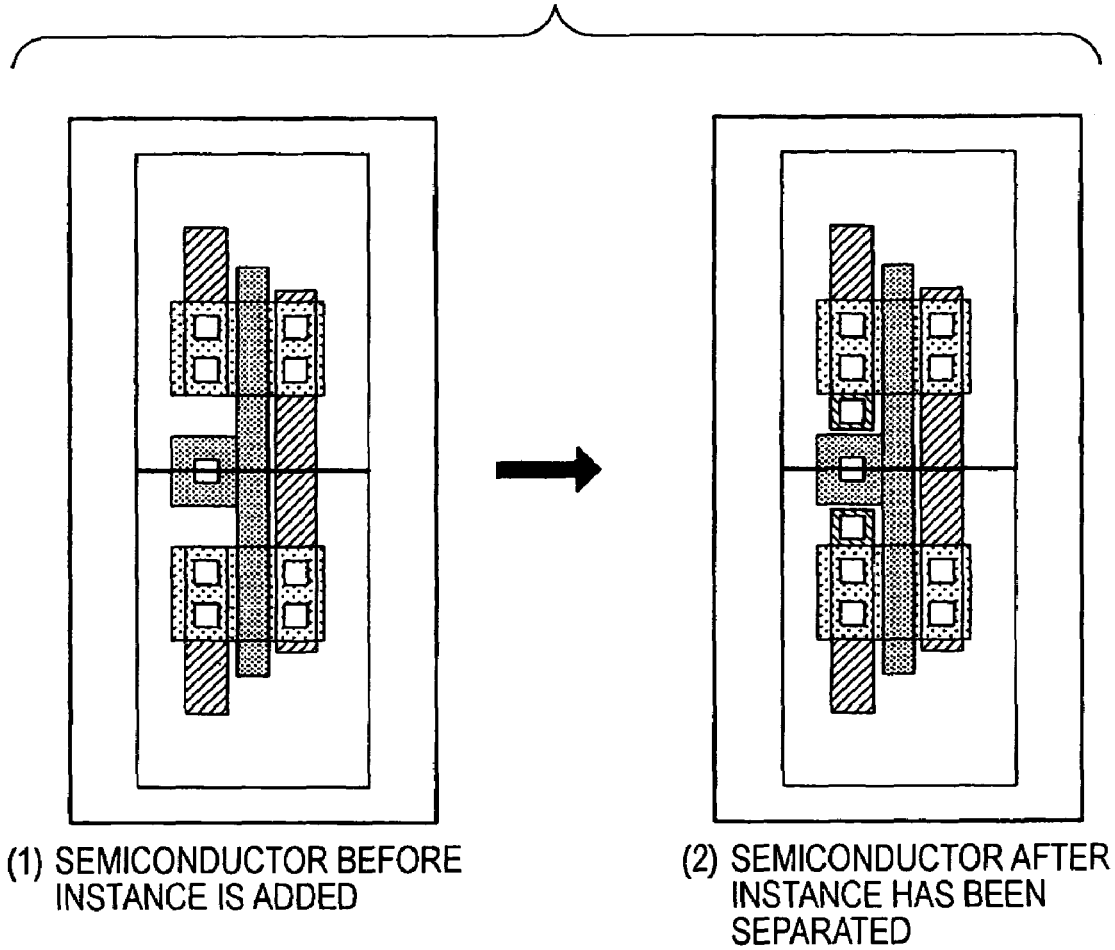
FIG. 4 is a structural diagram in the semiconductor designing apparatus according to one embodiment of the present invention.
Figure 5:
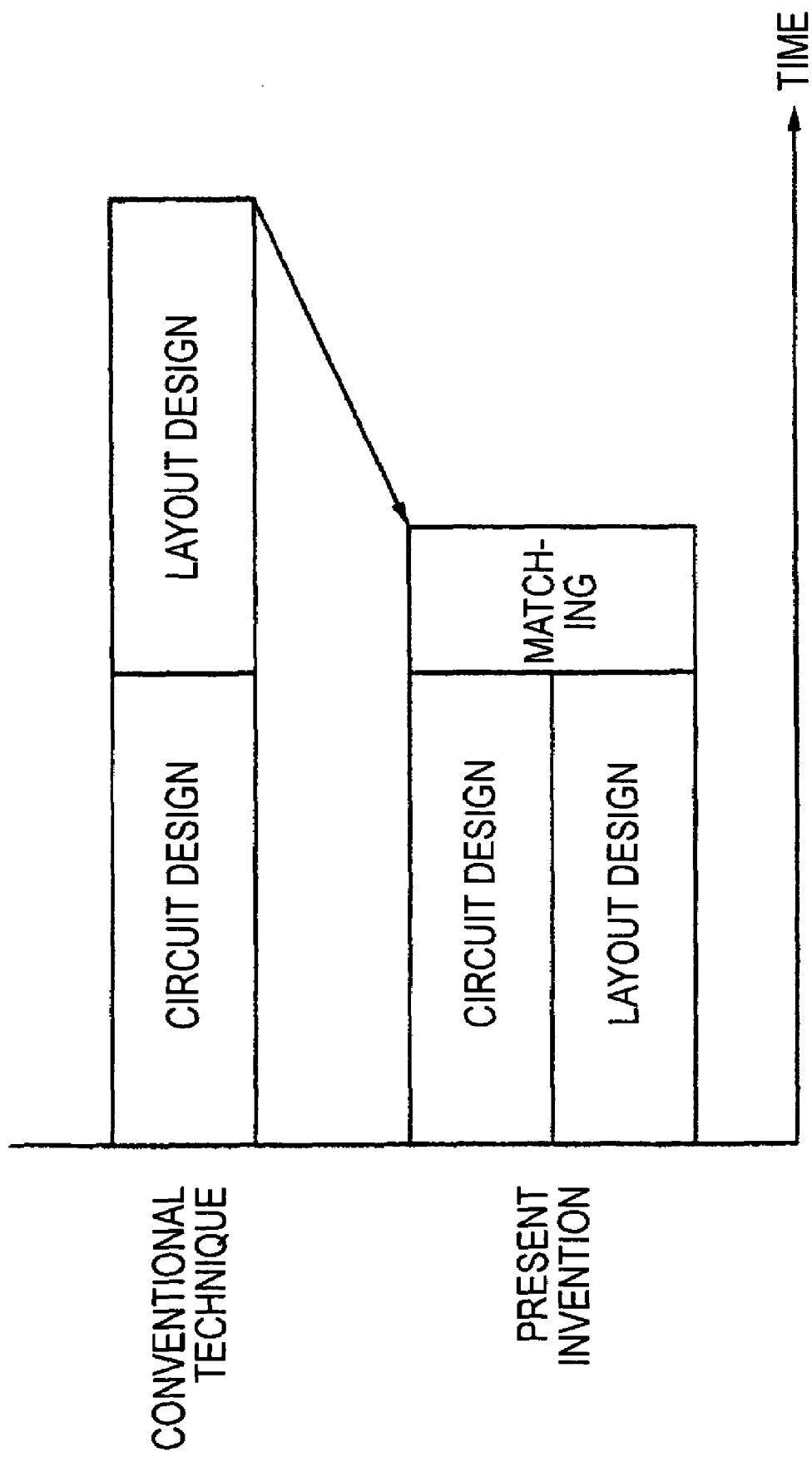
FIG. 5 is a structural diagram in the semiconductor designing apparatus according to one embodiment of the present invention.

FIG. 2 is a structural diagram in the semiconductor designing apparatus according to this embodiment; (1) is a structural diagram for showing a semiconductor before elements are separated; (2) is a structural diagram for representing a semiconductor while the elements are separated; and (3) is a structural diagram for indicating a semiconductor after the elements have been separated. FIG. 3 is a structural diagram in the semiconductor designing apparatus according to this embodiment; (1) is a structural diagram of M=1; and (2) is a structural diagram of M=2. FIG. 4 is a structural diagram in the semiconductor designing apparatus according to this embodiment; (1) is a structural diagram for showing a semiconductor before instances are added; and (2) is a structural diagram for representing a semiconductor after the instances have been added. FIG. 5 is an explanatory diagram for explaining a relationship between designing time as to circuit designing operations and layout designing operations in the conventional technique and this embodiment.

Figure 6:
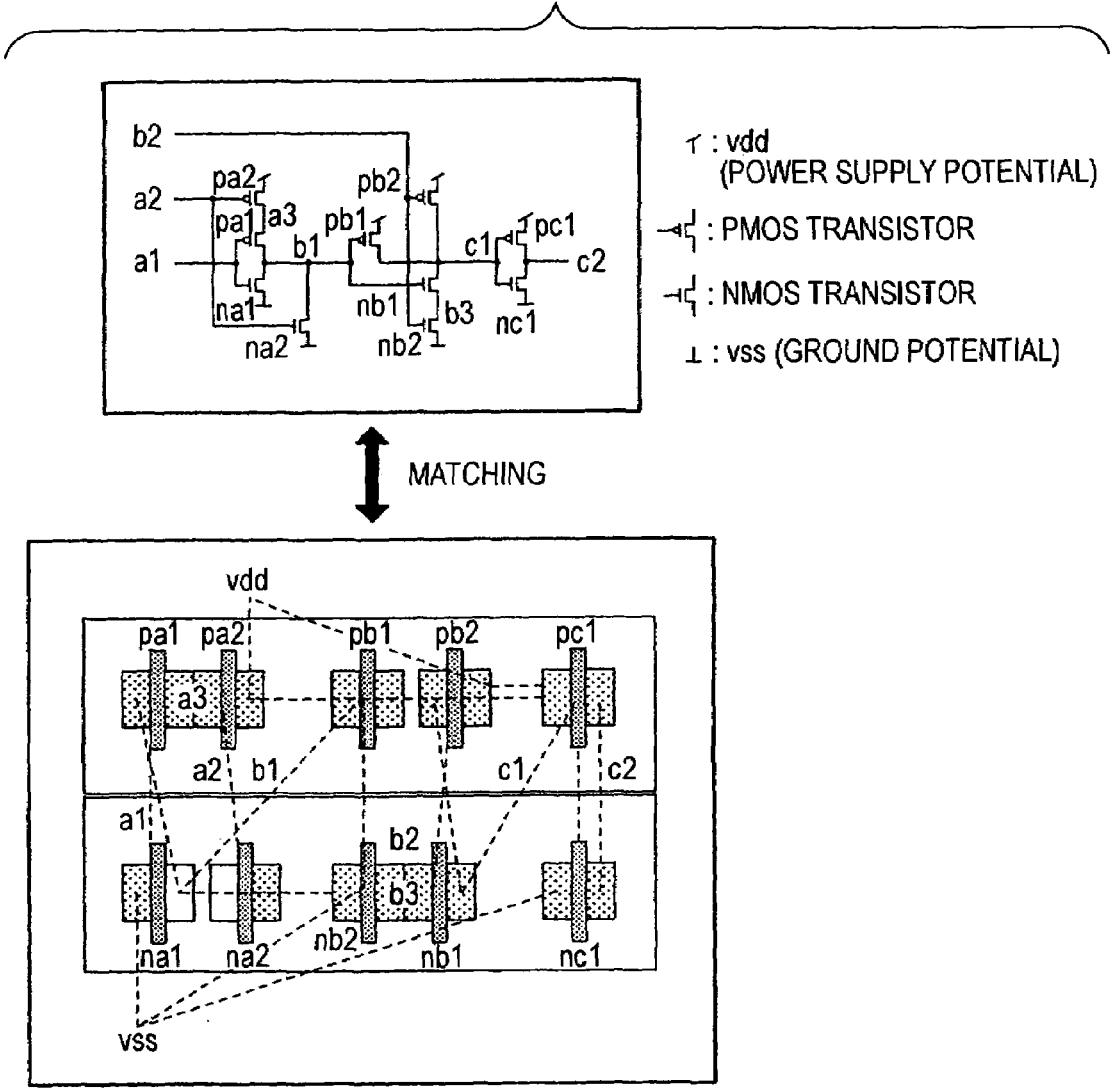
FIG. 6 is a structural diagram in the semiconductor designing apparatus according to one embodiment of the present invention.
Figure 7:
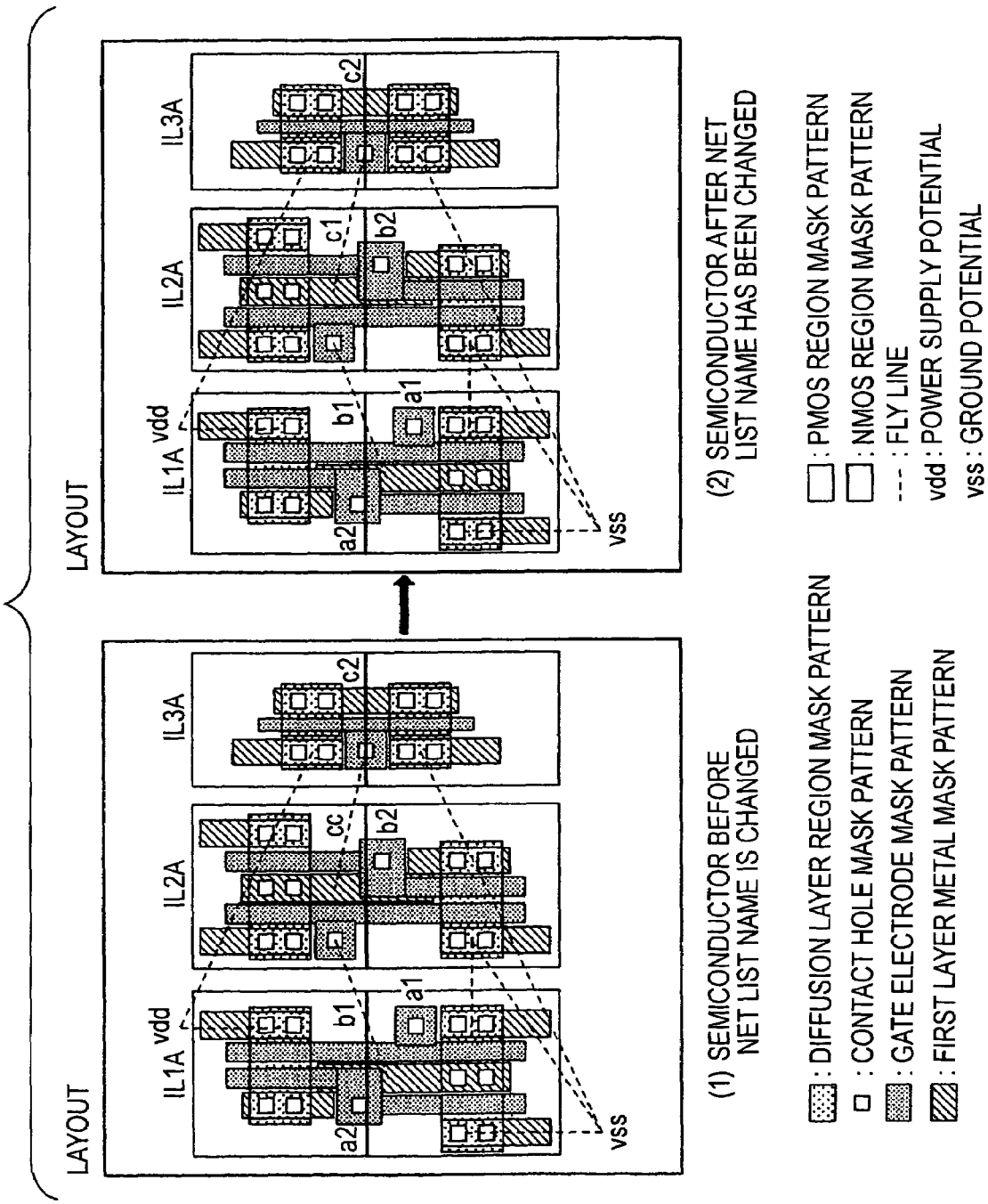
FIG. 7 is a structural diagram in the semiconductor designing apparatus according to one embodiment of the present invention.

FIG. 6 is a structural diagram in the semiconductor designing apparatus according to this embodiment, namely, such a structural diagram as an example which confirms as to whether or not a circuit is made coincident with a layout by way of a matching manner. FIG. 7 and FIG. 8 are structural diagrams in the semiconductor designing apparatus according to this embodiment, namely such an example that a net list name of a circuit is made coincident with a net list name of a layout; (1) shows a structural diagram obtained before the net list names are changed; and (2) indicates a structural diagram obtained after the net list names have been changed. In this example, a net list name "bb" of the layout has been changed into another net list name of "b1", and also, a net list name of "cc" of the layout has been changed into another net list name of "c1."

Figure 10:
FIG. 10 is a structural diagram in the semiconductor designing apparatus according to one embodiment of the present invention.

FIG. 9 is a structural diagram in the semiconductor designing apparatus according to this embodiment, namely, such an example that a different point between a circuit and a layout has been highlighted. That is, since symbol "IG2B" corresponding to a 2-input NOR in the circuit is different from symbol "IL2B" corresponding to a 2-input NAND in the layout, this different point has been highlighted. FIG. 10 is a structural diagram in the semiconductor designing apparatus according to this embodiment, namely, such an example that, i.e., a prohibited input file, a connection between output pins of a cell is prohibited. FIG. 11 is a structural diagram in the semiconductor designing apparatus according to this embodiment, namely, such an example that a connection between output pins of a cell is prohibited; (1) indicates conditions of a circuit and a layout before a prohibited input is avoided in advance; and (2) shows conditions of a circuit and a layout after the prohibited input has been avoided in advance. An output "PO" of an inverter IG1C was not connected to an output "PO" of another inverter IG2C.

FIG. 12 is a structural diagram in the semiconductor designing apparatus according to this embodiment, namely, such an example that an icon "B3" where a function of an inverter is illustrated is selected from an icon screen by clicking this icon "B3", and thus, an layout of the inverter is produced on a layout editing screen. As functions of inverters present in the circuit diagram (1), such layouts of (2) INV, (3) INVR, (4) INV2, and (5) INV2R are stored as a library.

Figure 14:
FIG. 14 is a structural diagram in the semiconductor designing apparatus according to one embodiment of the present invention.
Figure 15:
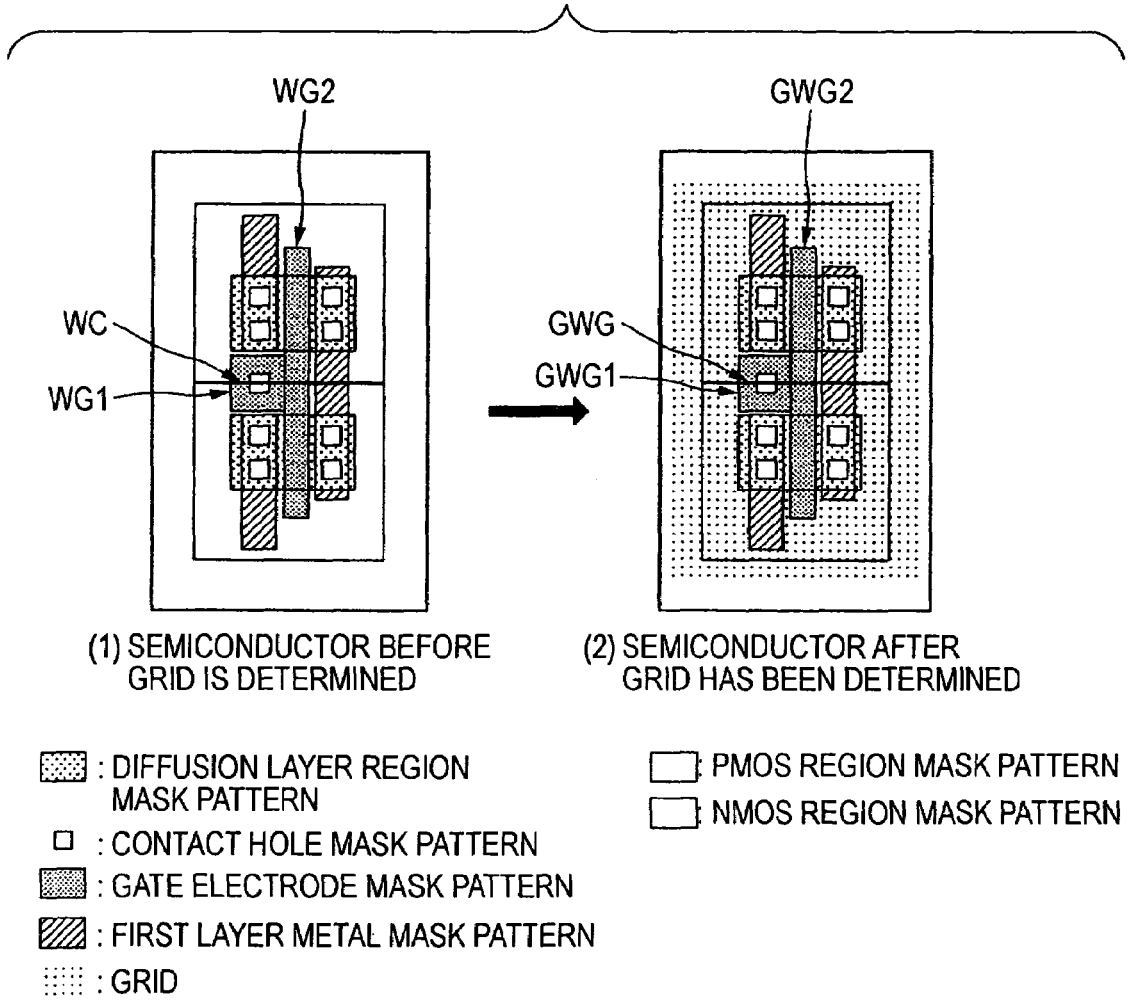
FIG. 15 is a structural diagram in the semiconductor designing apparatus according to one embodiment of the present invention.

FIG. 14 is a structural diagram in the semiconductor designing apparatus according to this embodiment, namely, such an example that an actual grid has been determined from a grid designation file. FIG. 15 is a structural diagram in the semiconductor designing apparatus according to this embodiment, namely, (1) indicates a condition of a layout before a grid is determined; (2) shows a condition of a layout after the grid has been determined. FIG. 16 is a structural diagram in the semiconductor designing apparatus according to this embodiment, namely, such an example indicates a condition in which an undefined portion of a circuit is handled by polygon data which has no relationship with a net list within a layout. FIG. 17 is a structural diagram in the semiconductor designing apparatus according to this embodiment, namely, such an example indicates a condition in which an undefined portion of a circuit is handled by polygon data which has no relationship with a net list within a layout, and furthermore, this polygon data is formed in a cell.

Figure 19:
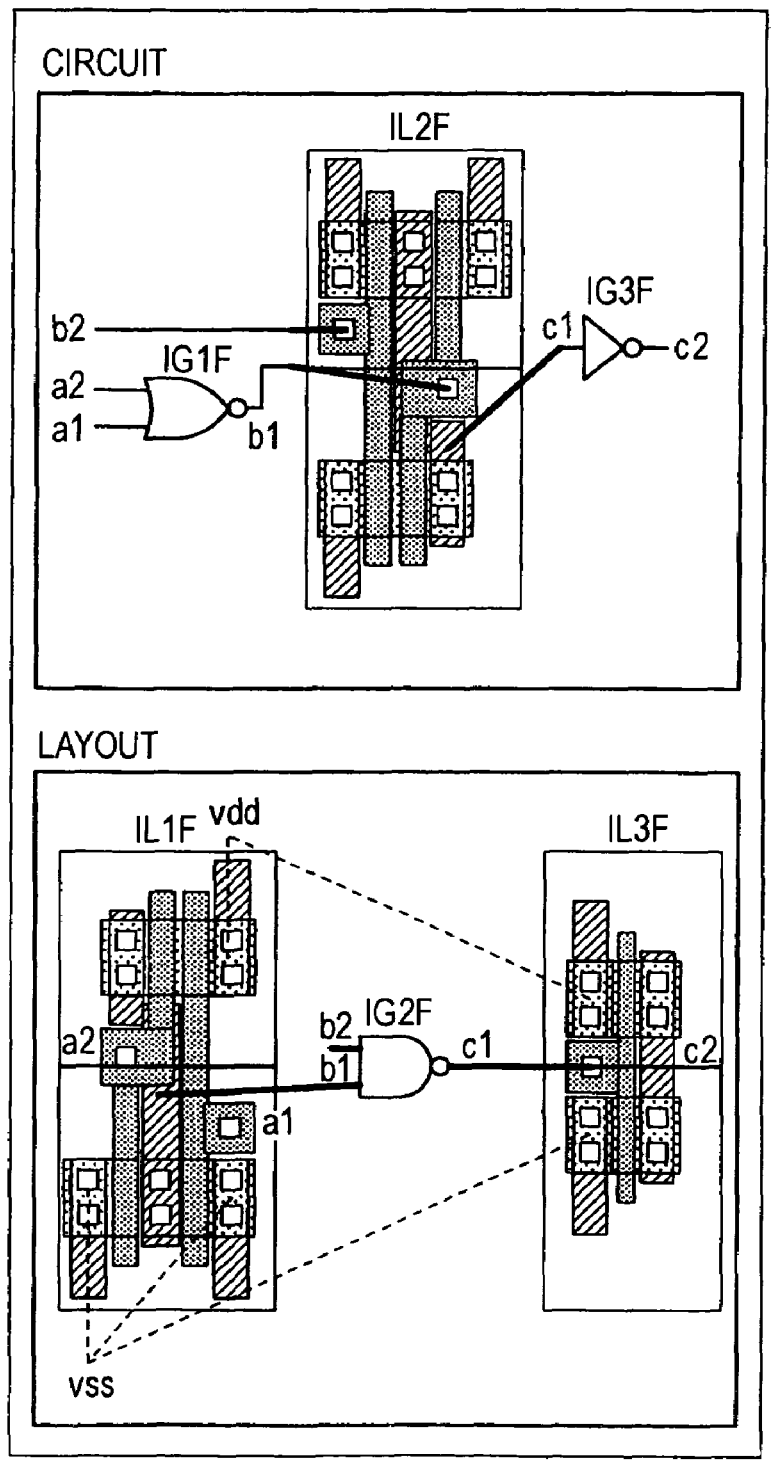
FIG. 19 is a structural diagram in the semiconductor designing apparatus according to one embodiment of the present invention.
Figure 20:
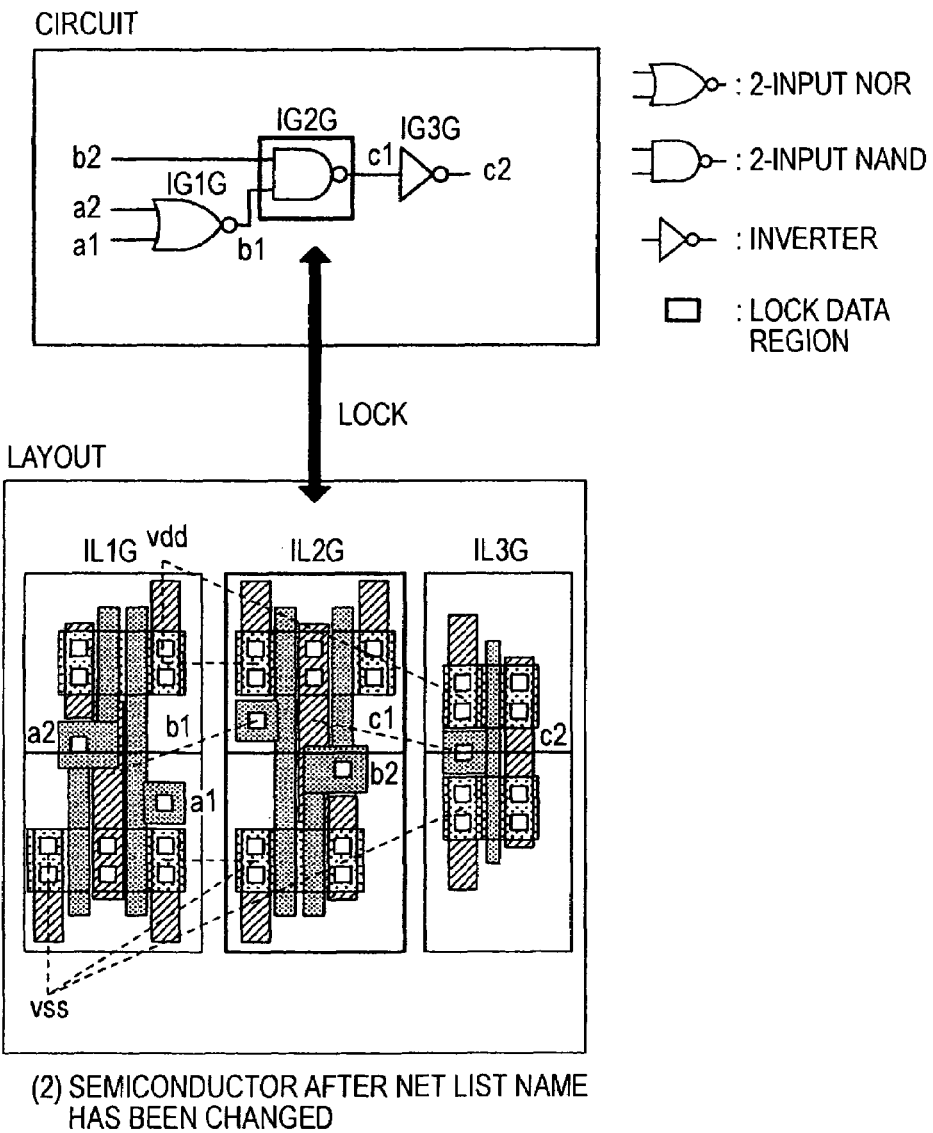
FIG. 20 is a structural diagram in the semiconductor designing apparatus according to one embodiment of the present invention.

FIG. 18 and FIG. 19 are structural diagrams in the semiconductor designing apparatus according to this embodiment, namely, editing screens for both circuits and layouts; (1) shows such a condition before mixing displays; (2) indicates such a condition after the mixing displays. In this example, in such a case that IG2F of a 2-input NAND located in the circuit is selected, a layout IL2F of the 2-input NAND is displayed. Also, in such a case that IL2F of a 2-input NAND located in the layout is selected, a circuit IG2F of the 2-input NAND is displayed. FIG. 20 is a structural diagram in the semiconductor designing apparatus according to this embodiment, namely indicates such a condition that when IG2G of a 2-input NAND located in a circuit is locked, IL2G corresponding thereto in a layout is locked in an interlocking manner, namely cannot be edited.

Figure 21:
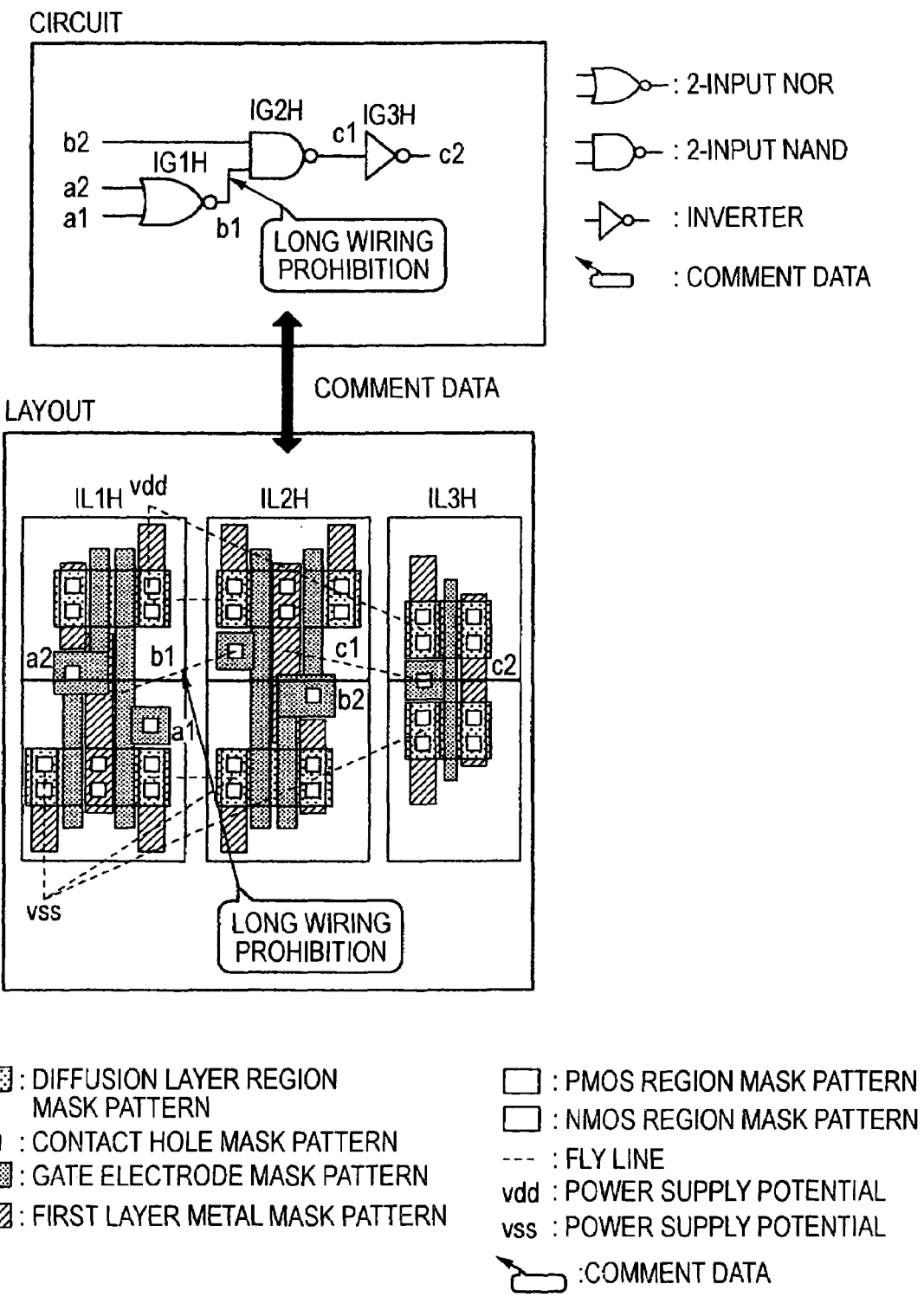
FIG. 21 is a structural diagram in the semiconductor designing apparatus according to one embodiment of the present invention.
Figure 23:
FIG. 23 is a structural diagram in the semiconductor designing apparatus according to one embodiment of the present invention.
Figure 25:
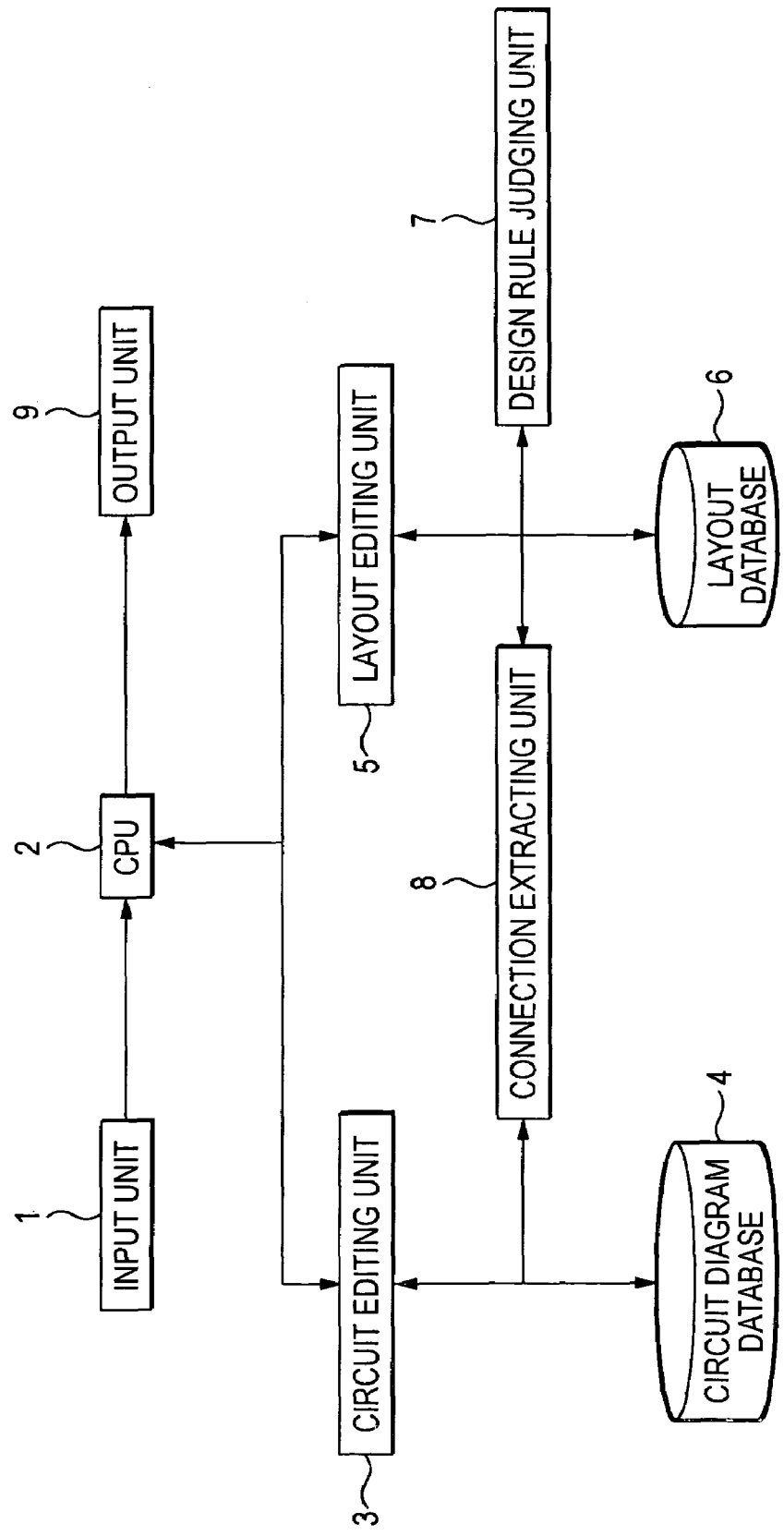
FIG. 25 is the structural diagram in the conventional semiconductor designing apparatus.

FIG. 21 is a structural diagram in the semiconductor designing apparatus according to this embodiment, namely, such a condition that when a comment is given to an output "b1" of IG1H of a 2-input NAND located in a circuit, a comment is also given to an output "b1" of IL1H corresponding thereto in a layout. FIG. 22 is a structural diagram in the semiconductor designing apparatus according to this embodiment. In this drawing, (1) shows a layout condition as to a wiring layer for two layers; and (2) shows a layout condition as to a wiring layer for three layers. FIG. 23 is a structural diagram in the semiconductor designing apparatus according to this embodiment, namely, a design process file shows an example that a gate length of a transistor is set in the case of 2.0 μm process, and also, a gate layout of a transistor is set in the case of 1.0 μm process. FIG. 24 is a structural diagram in the semiconductor designing apparatus according to this embodiment, namely, (1) shows such a layout condition in the case of 2.0 μm process, and also, (2) indicates such a layout condition the case of 3.0 μm process with respect to a circuit.

Next, a description is made of operations with respect to the semiconductor designing apparatus having the above-explained arrangement, according to this embodiment of the present invention.

<Operations for Mainly Explaining Sub-Circuit Recognizing Unit 10>

First of all, data entered to the input unit 1 is selected by the CPU 2. The CPU 2 transfers the selected data via the circuit editing unit 3 to the sub-circuit recognizing unit 10. The sub-circuit recognizing unit 10 recognizes a sub-circuit based upon the net list information of the circuit among the data which have been transferred from the CPU 2. Then, the CPU 2 derives such a layout data from the layout database 6, and then, transfers the derived layout data to the layout editing unit 5. This layout data corresponds to the sub-circuit which has been recognized via the layout editing unit 5 by the sub-circuit recognizing unit 10. The layout editing unit 5 executes a layout editing operation based upon the data of the layout. Then, the layout editing unit 5 transfers the result of this layout editing operation to the CPU 2, and then, this CPU 2 outputs this layout editing result from the output unit 9 to an external unit.

Figure 26:
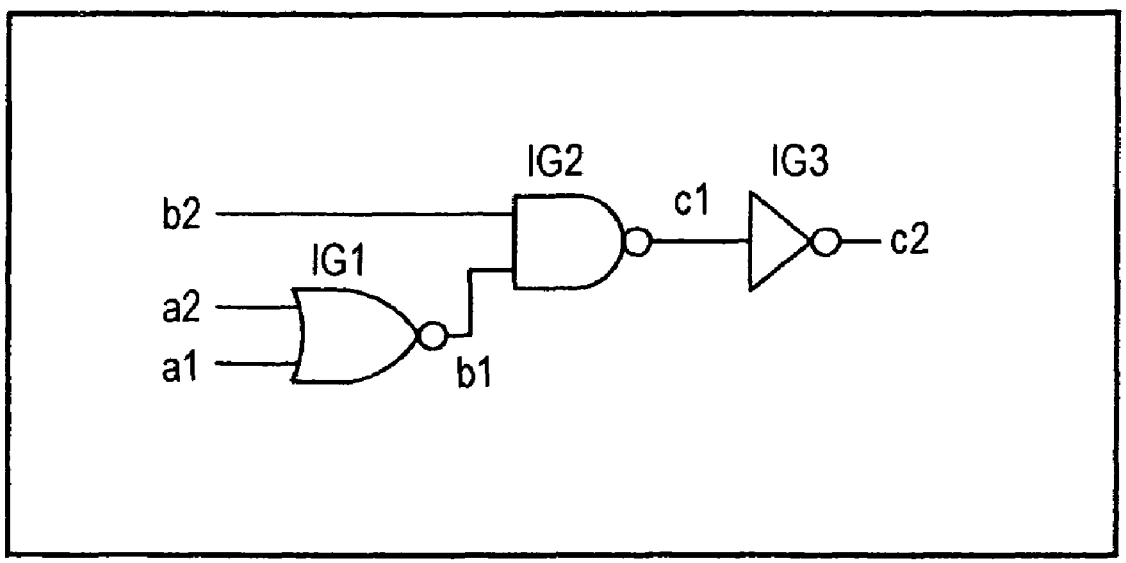
FIG. 26 is the structural diagram in the conventional semiconductor designing apparatus.
Figure 27:
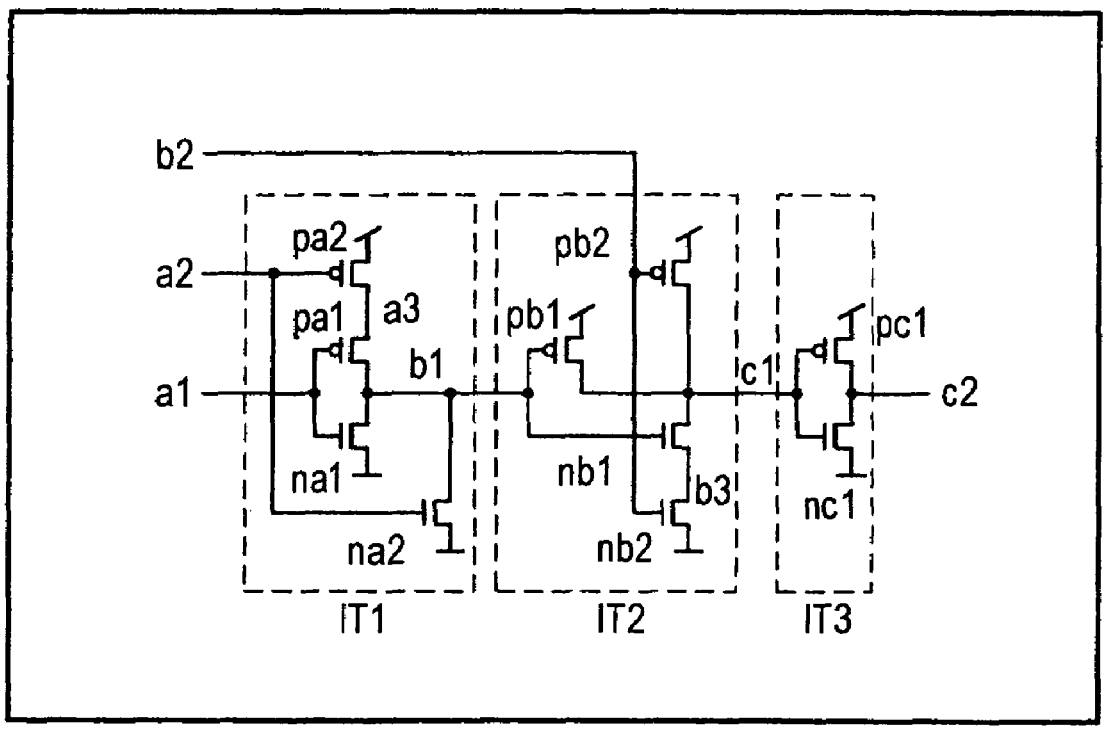
FIG. 27 is the structural diagram in the conventional semiconductor designing apparatus.
Figure 28:
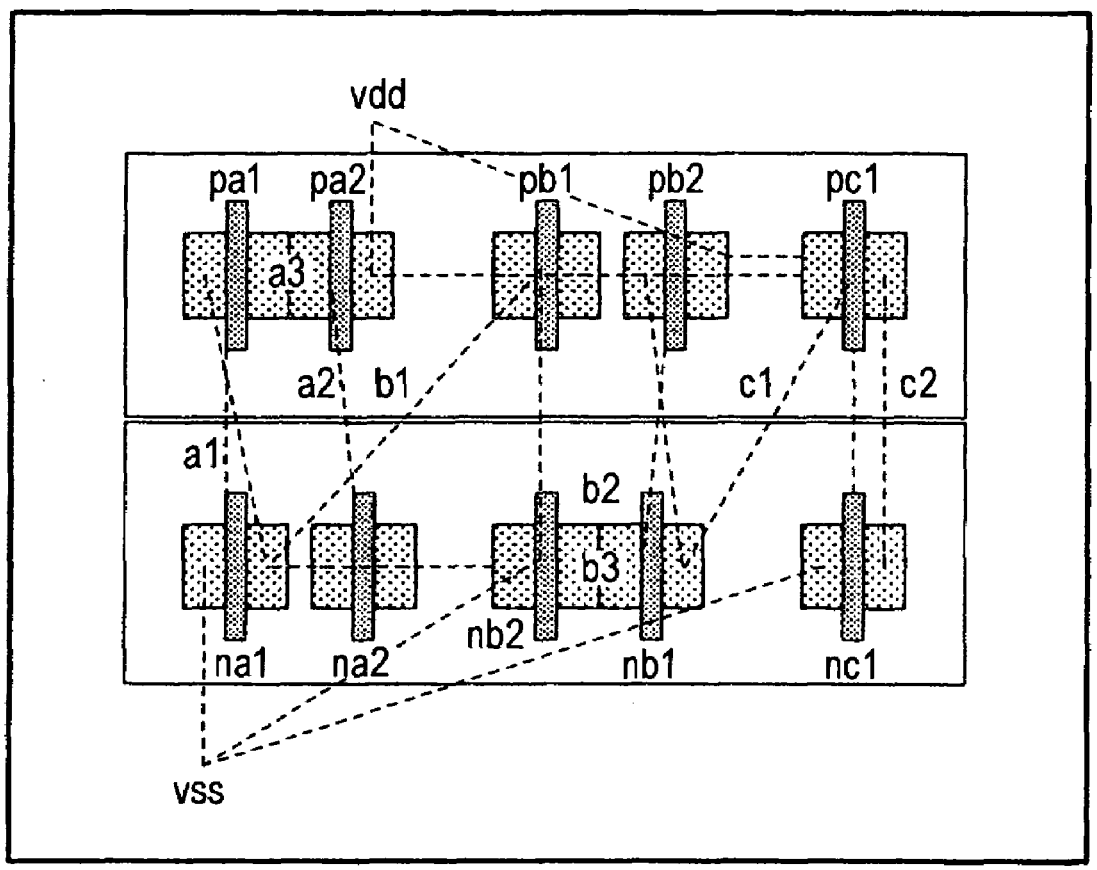
FIG. 28 is the structural diagram in the conventional semiconductor designing apparatus.
Figure 30:
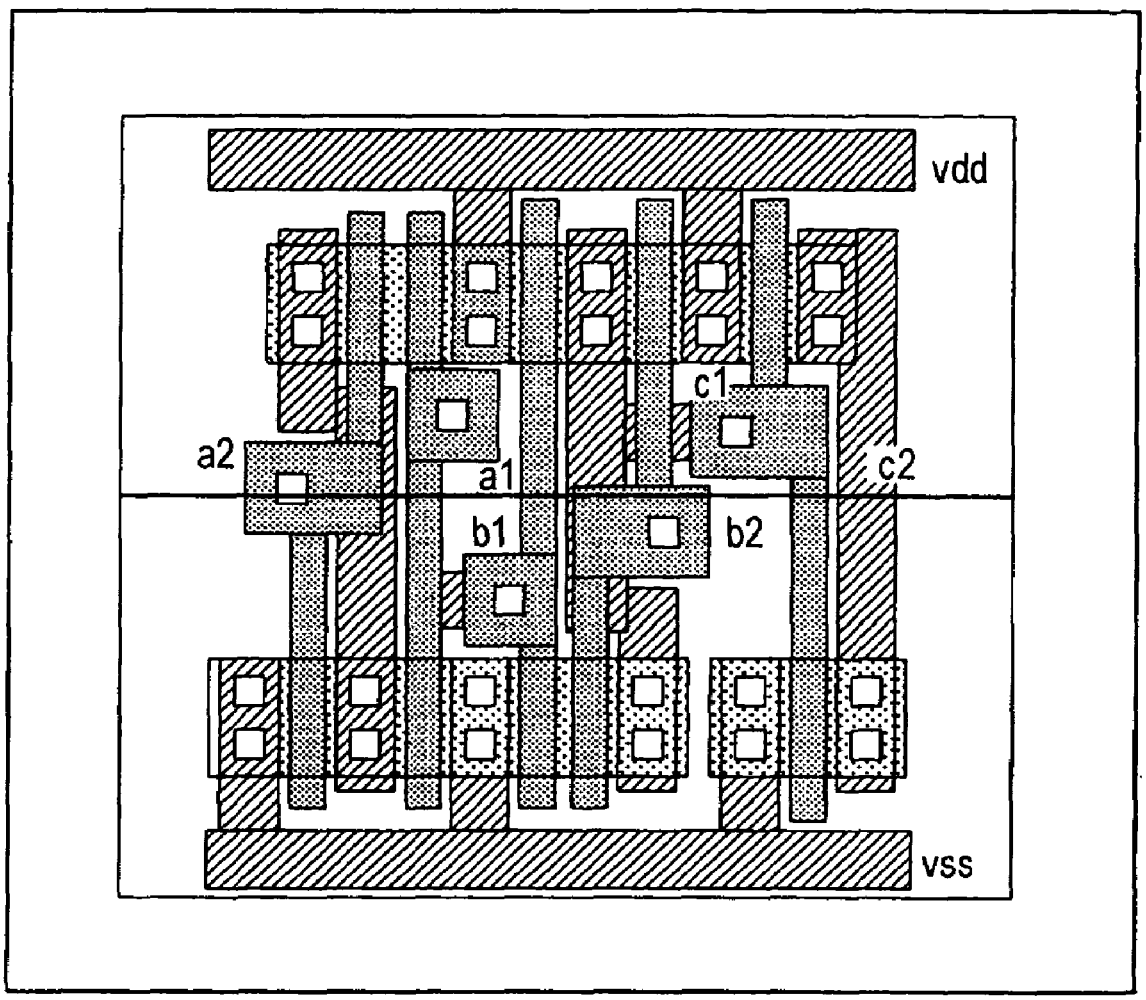
FIG. 30 is the structural diagram in the conventional semiconductor designing apparatus.

In the conventional semiconductor designing apparatus, such a layout as shown in FIG. 30 has been constructed by editing the circuit diagram of the gate level shown in FIG. 26 to obtain the circuit of the transistor level indicated in FIG. 27 by the circuit editing unit 3. Otherwise, the designing operation has been carried out from the circuit diagram of the transistor level shown in FIG. 27, data has been supplied to the layout editing unit 5, and the layout of the transistor level indicated in FIG. 28 has been rearranged to obtain the layout as represented in FIG. 30 in such a manner that arranging operations and wiring operations are semi-automatically carried out every element.

Figure 29:
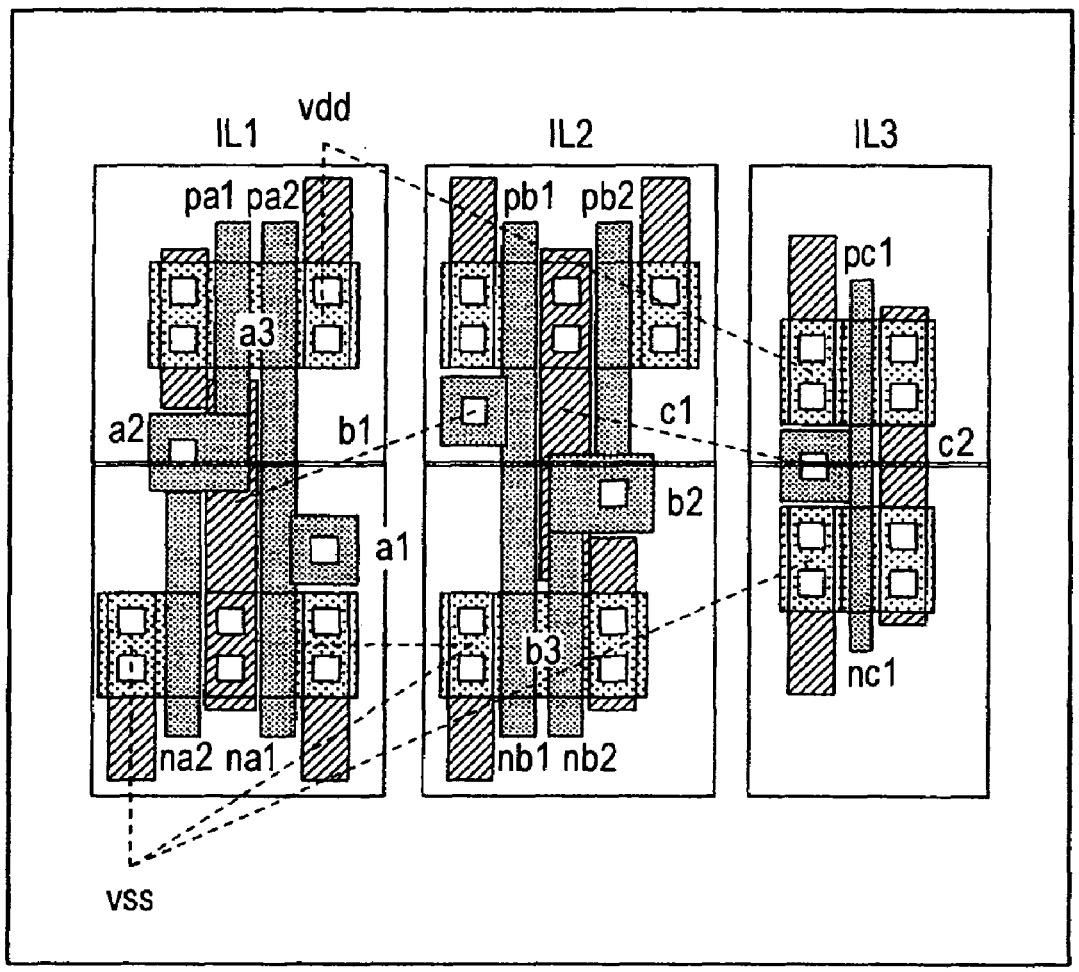
FIG. 29 is the structural diagram in the conventional semiconductor designing apparatus.

In contrast to the above-described conventional semiconductor designing apparatus, in accordance with the semiconductor designing apparatus of this embodiment, the sub-circuit recognizing unit 10 recognizes an IG1 of a 2-input NOR, an IG2 of a 2-input NAND, and an IG3 of an inverter from the circuit diagram of the gate level shown in FIG. 26; an IL1 of a 2-input NOR, an IL2 of a 2-input NAND, and an IL3 of an inverter are derived from the layout database 6 as represented in the structural diagram of the layout shown in FIG. 29; and then, the layout editing unit 5 performs both an arranging operation and a wiring operation as to these derived sub-circuits in a semi-automatic manner. At this time, since the layout is produced every sub-circuit, the arranging operations of the PMOS/NMOS transistors pa1, pa2, na1, na2, and the wiring operations of the inputs/outputs a1, a2, a3 have already been carried out, which constitute the 2-input NOR IL1; the arranging operations of the PMOS/NMOS transistors pb1, pb2, nb1, nb2, and the wiring operations of the inputs/outputs b1, b2, b3 have already been carried out, which constitute the 2-input NAND IL2; and, the arranging operations of the PMOS/NMOS transistors pc1, nc1, and the wiring operations of the inputs/outputs c1, c2 have already been carried out, which constitute the inverter. As a result, the internal arranging operations and the internal wiring operations of the structural elements can be omitted, and the desirable semiconductor can be designed by merely arranging and wiring the structural elements with each other, so that a designing time duration can be shortened.

<Operations for Mainly Explaining Element Structure Separating Unit 11>

The data entered to the input unit 1 is selected by the CPU 2. Then, the CPU 2 transfers the selected data via the layout editing unit 5 to the element structure separating unit 11. This element structure separating unit 11 separates the element structures, while the element structure separating unit 11 maintains connection information among elements of layout data within the data transmitted from the CPU 2. The layout editing unit 5 edits the layout based upon the data of this layout. A result of the layout editing operation is outputted from the output unit 9. For instance, FIG. 2 is a structural diagram of a layout. When an exemplification of an layout of an inverter is explained, the element structural separating unit 11 separates such a layout diagram (1) obtained before elements are separated into "pd1" and "pd2" as represented in the structural diagram (2) while elements are being separated. Next, the layout editing unit 5 executes an arranging operation and a wiring operation in a semi-automatic manner as represented in the structural diagram (3) obtained after the elements have been separated. Since the element structure is separated by the element structure separating unit 11, the internal shapes of the structural elements can be easily changed.

<Operations for Mainly Explaining Element Attribute Designating Unit 12>

The data entered to the input unit 1 is selected by the CPU 2. Then, the CPU 2 transfers the selected data via the layout editing unit 5 to the element attribute designating unit 12. This element attribute designating unit 12 changes attributes of elements, while the element attribute designating unit 12 maintains connection information among elements of layout data within the data transmitted from the CPU 2. The layout editing unit 5 edits the layout based upon the data of this layout. A result of the layout editing operation is outputted from the output unit 9. For instance, FIG. 3 is a structural diagram of a layout. When an exemplification as to a layout of an inverter is explained, in such a case that such an input instruction is entered from the input unit 1 in such a manner that element attributes of the inverter are changed from M=1 into M=2, the element attribute designating unit 12 changes such a layout of a diagram (1) M=1 into another layout of a diagram (2) M=2. Since the attributes of the elements can be changed by the element attribute designating unit 12, a freedom degree of the layout is improved.

<Operations for Mainly Explaining Instance Adding Unit 13>

The data entered to the input unit 1 is selected by the CPU 2. Then, the CPU 2 transfers the selected data via the layout editing unit 5 to the instance adding unit 13. This instance adding unit 13 adds an instance, while the instance adding unit 13 maintains connection information among elements of layout data within the data transmitted from the CPU 2. The layout editing unit 5 edits the layout based upon the data of this layout. A result of the layout editing operation is outputted from the output unit 9. For instance, FIG. 4 is a structural diagram of a layout. When an exemplification as to a layout of an inverter is explained, in such a case that such an input instruction is entered from the input unit 1 in such a manner that such an instance as a substrate contact is added to the inverter, the instance adding unit 13 changes a layout of a diagram (1) obtained before an instance is added into another layout of a diagram (2) obtained after the instance has been added. Since the instance can be added to the arbitrary place by the instance adding unit 13, the substrate contact and/or the monitoring-purpose PAD can be freely inserted, which does not depend upon the circuit diagram.

<Operations for Mainly Explaining Provisional Net Name Producing Unit 14 and Circuit Net Name Judging Unit 15>

The data entered to the input unit 1 is selected by the CPU 2. Then, the CPU 2 stores the selected data via the layout editing unit 5 to the layout database 6. In the case that such an instruction is entered from the input unit 1 that a layout is formed when there is no circuit diagram, the layout editing unit 5 forms a new layout in the provisional net name which has been added by the provisional net name producing unit 14 in the layout under formation.

The provisional net name forming unit 14 adds the provisional net name to the layout under formation. The circuit data is sent to the circuit editing unit 3, and then is stored in the circuit database 4. In the case that an instruction for forming a circuit diagram is issued from the input unit 1, the circuit is formed in the circuit editing unit 3. Next, when both the circuit designing operation and the layout designing operation are accomplished, in such a case that an instruction as to whether or not the circuit is made coincident with the layout is entered from the input unit 1, the circuit net name judging unit 15 judges a name which is related to both the circuit and the layout. Next, a design result of the circuit, a design result of the layout, and a result obtained by judging the name which is mutually related to the circuit and the layout are outputted from the output unit 9.

FIG. 5 is an explanatory diagram for explaining features achieved in this embodiment. That is, FIG. 5 explains that in the conventional technique, if the circuit designing operation is not completed, then the layout designing operation cannot be commenced. To the contrary, in accordance with the present invention, both the circuit designing operation and the layout designing operation can be commenced at the same time, and finally, such a confirmation is made that the circuit is matched with the layout, so that an effect for shortening the designing time period can be achieved. FIG. 6 is a structural diagram which indicates the following conditions. That is, as to a circuit, a designing operation is commenced in the circuit; as to a layout, a designing operation is commenced in the layout; and then, a confirmation is made that the circuit is matched with the layout. Since the layout designing operation can be carried out before the circuit is determined, the developing period can be shortened.

<Operations for Mainly Explaining Net Name Adjusting Unit 16>

The data entered to the input unit 1 is selected by the CPU 2. At this time, circuit data is transmitted to the circuit editing unit 3, and then, is stored in the circuit database 4. In the case that such an instruction for forming a circuit diagram is issued from the input unit 1, a circuit forming operation is carried out by the circuit editing unit 3. Layout data is transmitted to the layout editing unit 5, and then is stored in the layout database 6.

In the case that such an instruction for causing a net list name of the circuit to be made coincident with a net list name of the layout is issued from the input unit 1, another instruction is issued from the circuit editing unit 3 via the net name adjusting unit 16, by which both the net list of the circuit and the net list of the layout are analyzed, and such a same net list name as that of the circuit is given to the layout. At this time, the layout editing unit 5 again applies the same net list name as that of the circuit to the layout. Next, a designing result of the circuit and a designing result of the layout are outputted from the output unit 9. For example, FIG. 7 and FIG. 8 are structural diagrams in the semiconductor designing apparatus, namely, show an example as follows: (1) indicates a layout before a net list name is changed; (2) shows a layout after the net list name has been changed; and the net list names "bb" and "cc" of the layouts are changed into the net list names "b1" and "c1" so as to be adapted to the circuits. Since the net list names of the circuit can be fitted to the net list names of the layout, a debugging operation can be easily carried out.

<Operations for Mainly Explaining Different Point Judging Unit 17>

The data entered to the input unit 1 is selected by the CPU 2. At this time, circuit data is transmitted to the circuit editing unit 3, and then, is stored in the circuit database 4. In the case that such an instruction for forming a circuit diagram is issued from the input unit 1, a circuit forming operation is carried out by the circuit editing unit 3. Layout data is transmitted to the layout editing unit 5, and then is stored in the layout database 6.

In the case that such an instruction for displaying a different point between the circuit and the layout is issued from the input unit 1, the connection extracting unit 8 confirms a connection condition between the circuit and the layout based upon the information supplied from the circuit editing unit 3 and the information supplied from the layout editing unit 5, and then, the different point judging unit 17 judges a different point between the circuit and the layout. Then, a result of the difference point between the circuit and the layout is highlighted, and the highlighted result is outputted from the output unit 9. FIG. 9 is a structural diagram in the semiconductor designing apparatus according to this embodiment, namely, shows such a condition that a different point between a circuit and a layout is highlighted. This example highlights that a 2-input NOR "IG2B"

of a circuit is different from a 2-input NAND "IL2B" of a layout. Since the different point between the circuit and the layout is highlighted, a debugging operation can be easily carried out.

<Operations for Mainly Explaining Prohibited Input Judging Unit 18>

The data entered to the input unit 1 is selected by the CPU 2. At this time, while prohibited input data is stored in the prohibited input circuit data is transmitted to the circuit editing unit 3, and then, is stored in the circuit database 4. In the case that an instruction for forming a circuit diagram is issued from the input unit 1, a circuit forming operation is carried out in the circuit editing unit 3. At this time, the prohibited input judging unit 18 judges such a case that an input item corresponds to the prohibited input data, and causes the circuit editing unit 3 not to edit the item of the prohibited input.

Layout data is transmitted to the layout editing unit 5, and then, is stored in the layout database 6. In the case that an instruction for forming a layout is issued from the input unit 1, a layout forming operation is carried out in the layout editing unit 5. At this time, the prohibited input judging unit 18 judges such a case that an input item corresponds to the prohibited input data, and causes the layout editing unit 5 not to edit the item of the prohibited input. Next, both a designed result of the circuit and a designed result of the layout are outputted from the output unit 9.

For example, FIG. 10 is a structural diagram in the semiconductor designing apparatus according to this embodiment, namely, indicates a prohibited input file which defines that output pins of cells are prohibited to be connected to each other, and an output pin of an inverter cell is equal to "PO." FIG. 11 is a structural diagram, namely represents (1) a condition that a prohibited input is previously avoided; and represents (2) a condition obtained after prohibited input has been avoided in advance as to each of a circuit and a layout. As to an output result of an inverter, IG1C is not connected to IG2C in the circuit, whereas IL1C is not connected to IL2C in the layout. Since the prohibited input can be avoided in advance, erroneous designing operation can be prevented.

<Operations for Mainly Explaining Icon Link Unit 20>

The data entered to the input unit 1 is firstly selected by the CPU 2. At this time, when the input data is selected, and then, a circuit editing operation and a layout editing operation are carried out, the icon link unit 20 is designated. The icon link unit 20 captures data for an icon from the display-purpose database 21. At this time, a condition of the icon link unit 20 is displayed on the circuit editing unit 3 and the layout editing unit 5.

Since the circuit diagram database 4 is linked to the layout database 6 by the icon link unit 20, when an item of the icon link unit 20 is selected by the circuit editing unit 3 and the layout editing unit 5, the selected data is captured by the circuit editing unit 3 and the layout editing unit 5 respectively. At this time, the editing operation of the circuit is carried out by the circuit editing unit 3, whereas the editing operation of the layout is carried out by the layout editing unit 5. Then, both a result of the circuit editing operation and a result of the layout editing operation are outputted from the output unit 9. For example, FIG. 12 is a structural diagram, namely, shows such an example that when an icon screen appears on an editing screen of the layout and a button "B3" indicative of the function of the inverter on the icon screen is selected, a layout of the inverter appears on the editing screen of the layout. Since the icon indicative of the function is depressed so as to produce data, a recognizing characteristic during the designing operation can be improved, so that the developing term can be shortened.

<Operations for Mainly Explaining Library Designating Unit 22>

The data entered to the input unit 1 is firstly selected by the CPU 2. At this time, the input data is selected, and an instruction for forming a library is transmitted to the library designating unit 22. The library designating unit 22 processes data of the circuit diagram database 4 and data of the layout database 6 in the form of libraries. The library-formed circuit data may be used in the circuit editing unit 3, and the library-formed layout data may be used in the layout editing unit 5.

Figure 13:
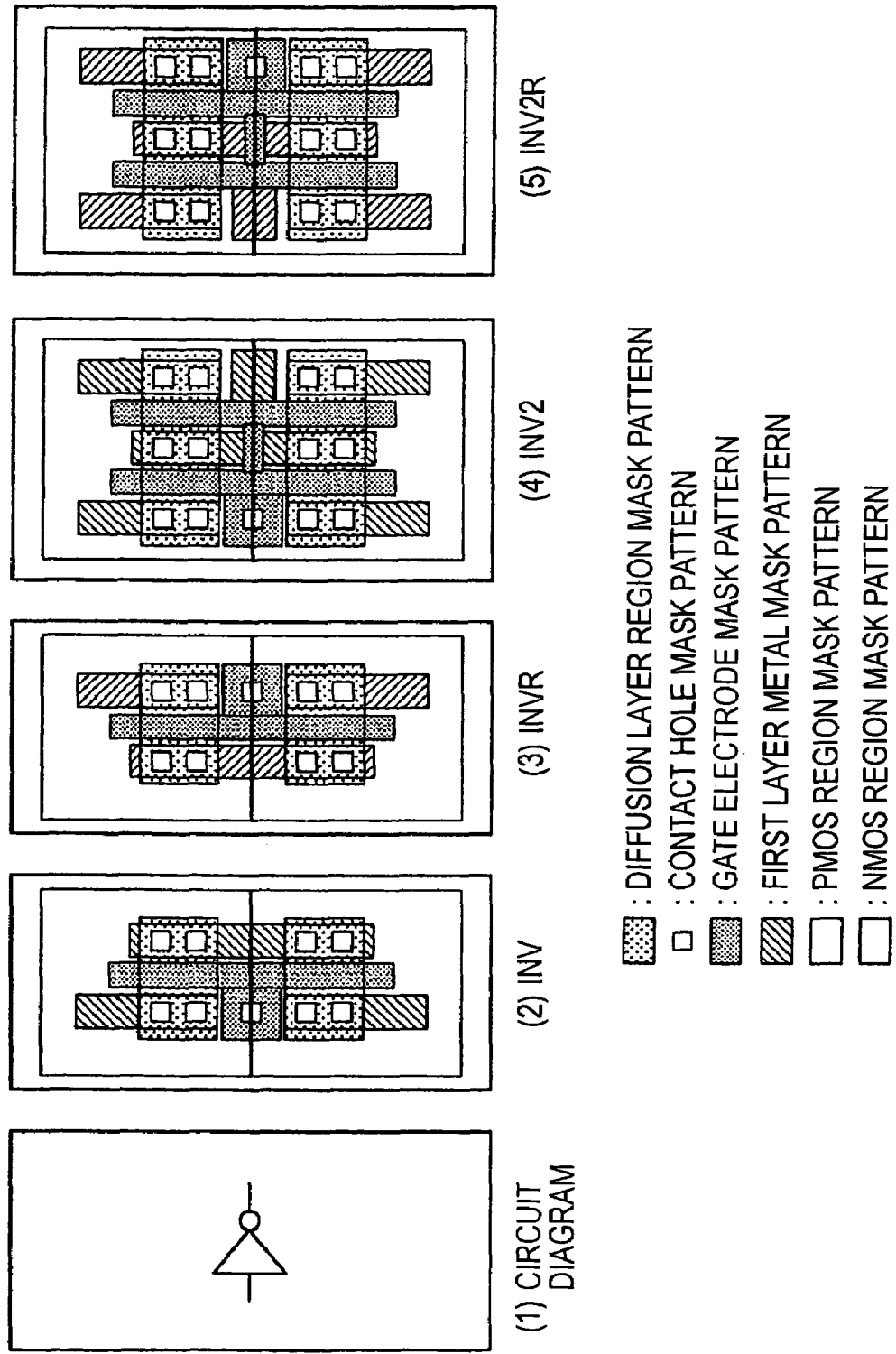
FIG. 13 is a structural diagram in the semiconductor designing apparatus according to one embodiment of the present invention.

Next, both a circuit designed result formed by the circuit editing unit 3 and a layout designed result formed by the layout editing unit 5 are outputted from the output unit 9. For example, FIG. 13 is a structural diagram in the semiconductor designing apparatus according to this embodiment; namely, (1) shows a circuit diagram of an inverter; (2) represents a layout diagram which is arranged in the name of "INV"; (3) shows a layout diagram which is arranged in the name of "INVR"; (4) represents a layout diagram which is arranged in the name of "INV2"; and (5) shows a layout diagram which is arranged in the name of "INV2R", which are processed in the form of libraries and may be freely used. Since the layouts as to the respective functions are processed in the form of libraries, the various sorts of shapes with respect to the same function can be easily produced, so that the designing time period can be shortened.

<Operations for Mainly Explaining Design Grid Correcting Unit 23>

The data entered to the input unit 1 is firstly selected by the CPU 2. At this time, the input data is selected, and layout data is transmitted to the layout editing unit 5, and then, is stored in the layout database 6. In the case that such an instruction for forming a layout is issued from the input unit 2, a layout forming operation is carried out by the layout editing unit 5. At this time, the layout forming operation is carried out in the layout editing unit 5 while a grid is not set. In the case that an instruction for designating the grid is issued from the input unit 1, this instruction is given to the design grid correcting unit 23. Thus, the design grid correcting unit 23 executes a grid designating operation of the layout data stored in the layout database 6. Then, a layout designed result is outputted from the output unit 9.

For example, FIG. 14 is a structural diagram in the semiconductor designing apparatus according to this embodiment, in which a definition for setting a grid to a grid designating file has been made. In this example, such a description is made. That is, a mask pattern width of a gate electrode can be calculated from a mask pattern width of a contact hole, and also, a decision of the grid is made by a formula which is indicated after the grid has been determined. In a structural diagram of FIG. 15, (1) shows a layout condition of an inverter before a grid is determined, and (2) represents a layout condition of the inverter after the grid has been determined. In other words, the structural diagram of FIG. 15 indicates such a condition that WC, WG1, WG2 before the grid is determined are set to GWC, GWG1, GWG2 after the grid has been determined. Since the designing grids can be determined later, the layout designing operation can be commenced before the design rule is defined.

<Operations for Mainly Explaining Function Undefined Portion Forming Unit 24>

The data entered to the input unit 1 is firstly selected by the CPU 2. At this time, circuit data is transmitted to the circuit editing unit 3, and then, is stored in the circuit database 4. In the case that such an instruction for forming a circuit diagram is issued from the input unit 1, a circuit forming operation is carried out by the circuit editing unit 3. Layout data is transmitted to the layout editing unit 5, and then is stored in the layout database 6. A place of an undefined portion in a circuit is formed by the function undefined portion forming unit 24 as polygon data which has no relationship with a net list in the layout. Then, a circuit designed result and a layout designed result are outputted from the output unit 9.

For example, FIG. 16 is a structural diagram in the semiconductor designing apparatus according to this embodiment, namely, such an example indicates a condition in which an undefined portion "IG2D" of a circuit is designed by polygon data which has no relationship with a net list as "IL2D" within a layout. In this example, the undefined portion of the circuit owns an undefined portion pin position, and the polygon data of the layout owns a polygon data pin position, so that the connection condition with respect to other portions is maintained. Since a connection with respect to polygon data having no net list is carried out, such a data whose function has not yet been defined can be handled.

<Operations for Mainly Explaining Cell-Process Executing Unit 26>

The data entered to the input unit 1 is firstly selected by the CPU 2. At this time, circuit data is transmitted to the circuit editing unit 3, and then, is stored in the circuit database 4. In the case that such an instruction for forming a circuit diagram is issued from the input unit 1, a circuit forming operation is carried out by the circuit editing unit 3. Layout data is transmitted to the layout editing unit 5, and then is stored in the layout database 6. A place of an undefined portion in a circuit is formed by the function undefined portion forming unit 24 as polygon data which has no relationship with a net list in the layout.

Next, the cell-process executing unit 26 executes a cell-process of the polygon data. At this time, while the element information extracting unit 25 is used, the polygon data may be alternatively extracted, and a net list may be alternatively extracted. The data which has been cell-processed may be continuously used in both the circuit correcting unit 3 and the layout correcting unit 5. Then, a circuit designed result and a layout designed result are outputted from the output unit 9. For example, FIG. 17 is a structural diagram in this embodiment, namely, indicates such a condition that while an undefined portion "IG2E" of a circuit is again used as IG4E, this undefined portion is designed as "IL2E" in the layout by way of the polygon data having no relationship with the net list, and then, is again used as IL4E. Since the polygon data is cell-processed to be again used, the undefined data can be reused.

<Operations for Mainly Explaining Mutual Display Unit 27>

The data entered to the input unit 1 is firstly selected by the CPU 2. At this time, circuit data is transmitted to the circuit editing unit 3, and then, is stored in the circuit database 4. In the case that such an instruction for forming a circuit diagram is issued from the input unit 1, a circuit forming operation is carried out by the circuit editing unit 3. Layout data is transmitted to the layout editing unit 5, and then is stored in the layout database 6. In the case that such an instruction for forming a layout is issued from the input unit 1, the layout editing unit 5 executes a layout forming operation. At this time, in the case that an instruction for selectively displaying a circuit and a layout is issued from the input unit 1, the mutual display unit 27 selectively synthesizes the circuit of the circuit diagram database 4 with the layout of the layout database 6. Then, such a display condition that the circuit has been mixed with the layout is outputted from the output unit 9.

For instance, FIG. 18 and FIG. 19 are structural diagrams in the semiconductor designing apparatus according to this embodiment, namely, (1) shows a circuit and a layout before mixing displays; (2) indicates the circuit and the layout after the mixing displays. In this example, in such a case that IG2F of a 2-input NAND located in the circuit is mixed in the layout display, a layout IL2F of the 2-input NAND is displayed. Also, in such a case that IL2F of a 2-input NAND located in the layout is mixed in the circuit displayed, a circuit IG2F of the 2-input NAND is displayed. Since the circuit display and the layout display are selectively mixed, the circuit recognizing characteristic when the designing operation is carried out can be improved, which can avoid the erroneous designing operation.

<Operations for Mainly Explaining Lock Designating Unit 28>

The data entered to the input unit 1 is firstly selected by the CPU 2. At this time, circuit data is transmitted to the circuit editing unit 3, and then, is stored in the circuit database 4. In the case that such an instruction for forming a circuit diagram is issued from the input unit 1, a circuit forming operation is carried out by the circuit editing unit 3. Layout data is transmitted to the layout editing unit 5, and then is stored in the layout database 6. In the case that such an instruction for forming a layout is issued from the input unit 1, a layout forming operation is carried out by the layout editing unit 5. At this time, in the case that such an instruction for locking in either the circuit or the layout is issued from the input unit 1, the lock designating unit 28 mutually locks subject places of the circuit diagram database 4 and the layout database 6. Then, both the circuit and the layout, which have been locked by the lock designating unit 28 cannot be edited by the circuit editing unit 3 and the layout editing unit 5 until the lock designating unit 28 releases the locking conditions. Then, the data of the circuit and the data of the layout are outputted from the output unit 9.

For example, FIG. 20 is a structural diagram in the semiconductor designing apparatus according to this embodiment, namely indicates such a condition that when IG2G of a 2-input NAND 1 located in a circuit is locked, IL2G corresponding thereto in a layout is also locked. Since the designated cell is locked, it is possible to avoid an erroneous correction of such a cell which is not changed.

<Operations for Mainly Explaining Comment Input Unit 29>

The data entered to the input unit 1 is firstly selected by the CPU 2. At this time, circuit data is transmitted to the circuit editing unit 3, and then, is stored in the circuit database 4. In the case that such an instruction for forming a circuit diagram is issued from the input unit 1, a circuit forming operation is carried out by the circuit editing unit 3. Layout data is transmitted to the layout editing unit 5, and then is stored in the layout database 6. In the case that such an instruction for forming a layout is issued from the input unit 1, a layout forming operation is carried out by the layout editing unit 5. At this time in the case that such an instruction for entering a comment into either the circuit or the layout is issued from the input unit 1, the comment input unit 29 enters comments into a subject portion of the circuit diagram database 4 and a subject portion of the layout database 6 with respect to the corresponding circuit and the corresponding layout, respectively.

As to the circuit and the layout, into which the comments have been entered by the comment input unit 29, the contents of the comments can be commonly shared by the circuit editing unit 3 and the layout editing unit 5. Then, both the data of the circuit and the data of the layout are outputted from the output unit 9. For example, FIG. 21 is a structural diagram in the semiconductor designing apparatus according to this embodiment, namely, indicates such a condition that when long wiring prohibition and a comment are given to an input "b1" of IG2H of a 2-input NAND located in a circuit, the comment and the long wiring prohibition are also automatically given to the input "b1" of IL2H of the 2-input NAND in an interconnection manner. Since the comment is entered, an attention point is described in the circuit sense, which may avoid that a designing idea of a circuit designer is erroneously succeeded to a layout designer.

<Operations for Mainly Explaining Use Cell Selecting Unit 30>

The data entered to the input unit 1 is firstly selected by the CPU 2. At this time, in the case that such an instruction for forming a layout is issued from the input unit 1, a layout forming operation is carried out by the layout editing unit 5. At this time, when a wiring layer to be used is designated from the input unit 1, the use cell selection unit 30 selects layout data of the corresponding wiring layer from the layout database 6, and then, sends the selected layout data to the layout editing unit 5. In the layout editing unit 5, a layout designing operation can be carried out based upon the optimum data with respect to the wiring layer to be used. Then, data of the layout is outputted from the output unit 9.

For instance, FIG. 22 is a structural diagram in the semiconductor designing apparatus according to this embodiment. In this drawing, (1) shows such a layout condition that a wiring layer for two layers is selected; and (2) shows such a layout condition that a wiring layer for three layers is selected. That is, FIG. 22 represents that IG1I of a 2-input NOR, IG2I of a 2-input NAND, and IG3I of an inverter in the circuit can be designed by using optimum cells in the wiring layers to be used in such a manner that in a layout in which the wiring layers are two wiring layers, these structural elements can be designed as IL1I, IL2I, IL3I, which are suitable for the wiring layer made of two layers; and can be designed as IL1J, IL2J, IL3J, which are suitable for the wiring layer made of three layers. Since the cells are automatically and separately used every wiring layer, the optimum layers to be fitted to the designed wiring layers can be designed.

<Operations for Mainly Explaining Design Process Changing Unit 31>

The data entered to the input unit 1 is firstly selected by the CPU 2. At this time, layout data is transmitted to the layout editing unit 5, and then, is stored in the layout database 6. In the case that such an instruction for forming a layout is issued from the input unit 1, a layout forming operation is carried out by the layout editing unit 5. At this time, in the layout editing unit 5, a layout forming operation is carried out under a process condition which has been defined in the beginning.

Next, in such a case that an instruction for changing the process condition is issued from the input unit 1, the changing instruction is given to the design process changing unit 31, and thus, this design process changing unit 31 changes the process condition with respect to the layout data of the layout database 6. Then, a layout designed result is outputted from the output unit 9. For instance, FIG. 23 is a structural diagram in the semiconductor designing apparatus according to this embodiment, in which such a condition is defined in a design process file under which a gate length of a transistor is changed. In this example, such a definition is firstly made. That is, in the case of 2.0 µm process, a gate length "TRL" of a transistor is equal to 2 µm. Also, another definition is made. That is, in the case of 1.0 µm process after the process has been changed, a gate length "TRL" of a transistor is equal to 1 µm.

In a structural diagram of FIG. 24, such conditions are represented in a layout of an inverter, namely, (1) shows the condition in the case of 2.0 µm process; and (2) indicates the condition in the case of 1.0 µm process. This structural diagram indicates that the gate length TRL of the transistor was 2 µm in the case of 2.0 µm process, and then, the length TRL of the transistor became 1 µm in the case of 1.0 µm process. As a result, the data can be converted into data used for the various sorts of processes, and thus, can be expanded for application purposes with respect to different processes.

As previously described, in accordance with the semiconductor designing apparatus of this embodiment, since the sub-circuit recognizing unit 10 for recognizing the sub-circuit every function from the circuit data is employed, the layout can be produced every function, so that the internal arranging operation and the internal wiring operation of the structural elements can be omitted, and thus, the designing time period can be shortened.

Also, since the sub-circuit recognizing unit 10 for recognizing the sub-circuit every function from the circuit data is employed and the element structure separating unit 11 for separating the element structures of the sub-circuit every element is provided, the element structures can be separated, and the internal shape of the structural elements can be readily changed, so that the freedom degree of the designing operation can be improved.

Also, since the element attribute designating unit 12 for changing the attributes of the elements is provided, the attributes of the elements can be changed, and the internal shape of the structural elements can be readily changed, so that the freedom degree of the designing operation can be improved.

Also, since the instance adding unit 13 for adding the instance to the element is employed, the instance can be added to the element, so that the insertion such as the substrate contact which does not depend upon the circuit diagram can be added to the arbitrary place.

Also, since the provisional net name producing unit 14 for producing the provisional net list name under production and the circuit name judging unit 15 for judging the relative relationship between the net list name of the circuit and the net list name of the layout are provided, the layout designing operation can be commenced before the circuit diagram is determined, and thereafter, the matching state of the net connection can be confirmed, so that both the circuit and the layout can be designed at the same time, and the designing time period can be shortened.

Also, since the net name adjusting unit 16 for automatically matching the net list name of the circuit with the net list name of the layout is employed, the names of the net list and the instance as to the circuit diagram can be made coincident with the names of the net list and the instance as to the layout in the automatic manner, so that the debugging operation can be readily carried out.

Also, since the different point judging unit 17 for judging the different point between the circuit and the layout and for highlighting the different point is employed, the different point between the circuit and the layout can be highlighted, so that the debugging operation can be easily carried out.

Also, since the prohibited input judging unit 18 for avoiding the prohibited input in advance is provided, the prohibited input can be avoided in advance, so that the erroneous designing operation can be prevented.

Also, since the icon link unit 20 for producing the corresponding layout in the case that the icon indicative of the function is depressed is provided, the relevant layout can be produced by depressing the icon indicative of the function, so that the recognizing characteristic during the designing operation can be improved and the developing term can be shortened.

Also, since the library designating unit 22 for forming the layout every function in the library form is employed, the layout every function can be formed in the library form, so that the various sorts of shapes can be generated in an easy manner, and a total number of designing steps can be reduced.

Also, since the design grid correcting unit 23 for correcting the design grid is provided, the design grid can be determined in the later stage, so that the designing operation can be commenced before the design rule is defined.

Also, since the function undefined portion forming unit 24 for connecting the undefined portion in the circuit to the polygon data having no net list is provided, the undefined portion in the circuit can be connected to the polygon data having no net list, so that the data whose function has not yet been defined can be handled.

Also, since the cell-process executing unit 26 for cell-process the polygon data which is not yet defined and has no net list in the circuit is provided, the polygon data can be processed in the cell form, so that the data whose function has not yet been defined can be reused.

Also, since the mutual display unit 27 for selectively mixing the display of the circuit with the display of the layout is provided, the display of the circuit can be selectively mixed with the display of the layout, so that the circuit recognizing characteristic during the designing operation can be improved and the erroneous designing operation can be avoided.

Also, since the lock designating unit 28 for locking the designated cell is provided, the designated cell can be locked, so that the cell which has been locked cannot be edited, and thus, it is possible to prevent such an erroneous correction as to the cell which is prohibited to be changed.

Also, since the comment input unit 29 for inputting the comment is provided, the comment input for the circuit can be linked to the comment input for the layout, so that the comment input unit 29 can avoid that the duty of the circuit designer is erroneously transferred to the layout designer.

Also, since the use cell selecting unit for automatically using the cells in the discriminatable manner in accordance with the designed wiring layer is employed, this use cell selecting unit 30 can automatically use the cells in the discriminatable manner every wiring layer, so that the optimum cell can be selected with respect to each of the designed wiring layers.

Also, since the design process changing unit 31 for automatically adapting the design data of the used process to other design data by selecting the process condition is employed, the data can be converted into the data used for the various sorts of processes, the data can be applied/expanded to the different processes.

It should be understood that although the above-explained embodiment has exemplified the designing apparatus for designing the semiconductor circuit, the present invention may be alternatively applied to a designing apparatus for designing a printed circuit board.

The present invention can be applied to layout designing fields with respect to semiconductor memory circuits and semiconductor analog circuits.

What is claimed is:

1. A semiconductor designing apparatus comprising:
   a data processor, processing a data based upon information entered from an input unit;
   a circuit diagram database, storing a circuit diagram data;
   a layout database, storing a layout data;
   a circuit editor, executing a circuit editing operation with respect to the data processed by the data processor by employing the circuit diagram database;
   a layout editor, executing a layout editing operation with respect to the data processed by the data processor by employing the layout data; and
   a sub-circuit recognizer, recognizing a sub-circuit corresponding to a function based on a netlist from the data entered by the data processor, and generating a relationship between a connection and a layout within said sub-circuit of circuit data contained in the data entered by the data processor and a structural diagram of the layout data.

2. The semiconductor designing apparatus as claimed in claim 1, further comprising:
   an element structure separating unit, separating an element structure of the sub-circuit.

3. The semiconductor designing apparatus as claimed in claim 2, further comprising:
   an element attribute designator, changing an attribute of the element.

4. The semiconductor designing apparatus as claimed in claim 2, further comprising:
   an instance adding unit, adding an instance to the element.

5. The semiconductor designing apparatus as claimed in claim 1, further comprising:
   a provisional net name generator, generating a provisional net list name in such a case that since an instruction for forming a layout having no circuit diagram is issued from the input unit and a new layout is formed by the layout editing means and a circuit is formed by the circuit editing means; and
   a circuit net name judging unit, judging a relative relationship between a net list name of the circuit and a net list name of the layout.

6. The semiconductor designing apparatus as claimed in claim 1, further comprising:
   a net name adjustor, making a net list name of a circuit coincident with a net list name of a layout in such a case that an instruction for making the net list names of the circuit and the layout coincident with each other is issued from the input unit.

7. The semiconductor designing apparatus as claimed in claim 1, further comprising:
   a different point judging unit, operated in such that in the case that an instruction for displaying a different point between a circuit and a layout is issued from the input unit, the different point judging unit confirms a connection condition between the circuit and the layout based upon the circuit diagram information of the circuit editor and the layout information of the layout editor, and judges a different point in the connection condition of the circuit and the layout, and then highlights the judged different point.

8. The semiconductor designing apparatus as claimed in claim 1, further comprising:

a prohibited input judging unit, operated in such a manner that while a circuit forming operation is carried out by the circuit editor in response to an instruction for forming a circuit diagram issued from the input unit, the prohibited input judging unit judges a prohibited input, and prohibits an editing operation in the circuit editor as to an item of the prohibited input.

9. The semiconductor designing apparatus as claimed in claim 1, further comprising:

an icon link unit, displaying an icon image indicative of functions of various sorts of elements on an editing screen when either a circuit editing operation or a layout editing operation is carried out, and producing a layout corresponding to an element designated by a user within the icon image, and displaying the produced layout.

10. The semiconductor designing apparatus as claimed in claim 1, further comprising:

a library designator, operated in such that in the case that a forming instruction is issued from the data processor, the library designator processes circuit data of the circuit diagram database and layout data of the layout database in the form of libraries respectively, the library-processed circuit data can be used in the circuit editor, and the library-processed layout data can be used in the layout editor.

11. The semiconductor designing apparatus as claimed in claim 1, further comprising:

a design grid corrector, operated in such that in the case that an instruction for forming a layout is issued from the input unit and a layout forming operation is carried out by the layout editor without setting a grid, and thereafter, an instruction for designating a grid is issued from the input unit, the design grid corrector performs a grid designation for the layout data of the layout database.

12. The semiconductor designing apparatus according to claim 1, further comprising:

a function undefined portion forming unit, forming an undefined portion which has not yet been defined within a circuit as such a polygon data which has no relationship with a net list within a layout.

13. The semiconductor designing apparatus as claimed in claim 12, further comprising:

a cell-process executor, cell-processing the polygon data.

14. The semiconductor designing apparatus as claimed in claim 1, further comprising:

a mutual display, operated in such that in the case that while an instruction for forming a layout is issued from the input unit, the layout is formed in the layout editor, and thereafter, another instruction for selectively displaying a circuit and a layout is issued from the input unit, the mutual display selectively mixes the display of the circuit with the display of the layout.

15. The semiconductor designing apparatus as claimed in claim 1, further comprising:

a lock designator, operated in such that in the case that an instruction for locking in either a circuit or a layout is issued from the input unit, the lock designator locks a subject place of the circuit diagram database and a subject place of the layout database with respect to the corresponding circuit and the corresponding layout.

16. The semiconductor designing apparatus as claimed in claim 1, further comprising:

a comment input unit, operated in such that in the case that an instruction for inputting a comment in either a circuit or a layout is issued from the input means, the comment input means inputs a comment in a subject place of the circuit diagram database and a subject place of the layout database with respect to the corresponding circuit and the corresponding layout.

17. The semiconductor designing apparatus as claimed in claim 1, further comprising:

a layout database, storing a layout data of a wiring line layer; and a use cell selector, operated in such that in the case that while an instruction for forming a layout is issued from the input unit, a layout forming operation is carried out in the layout editor, and thereafter, another instruction for designating a wiring layer to be used is issued from the input unit, the use cell selector selects layout data of the corresponding wiring layer from the layout database to apply the selected layout data to the layout editor.

18. The semiconductor designing apparatus as claimed in claim 1, further comprising:

a design process changing unit, operated in such that in the case that while an instruction for forming a layout is issued from the input unit, a layout forming operation is carried out under process condition which has been defined in the beginning by the layout editor, and thereafter, another instruction for changing the process condition is issued from the input unit, the design process changing unit changes the process condition with respect to the layout data of the layout database.

* * * * *